(12) United States Patent
Mitra et al.

(10) Patent No.: US 10,061,876 B2
(45) Date of Patent: Aug. 28, 2018

(54) BOUNDED VERIFICATION THROUGH DISCREPANCY COMPUTATIONS

(71) Applicant: The Board of Trustees of the University of Illinois, Urbana, IL (US)

(72) Inventors: Sayan Mitra, Urbana, IL (US); Chuchu Fan, Urbana, IL (US); Zhenqi Huang, Champaign, IL (US)

(73) Assignee: Board of Trustees of the University of Illinois, Urbana, IL (US)

( * ) Notice: Subject to any disclaimer, the term of this patent is extended or adjusted under 35 U.S.C. 154(b) by 351 days.

(21) Appl. No.: 14/979,061

(22) Filed: Dec. 22, 2015

(65) Prior Publication Data

US 2016/0179999 A1 Jun. 23, 2016

Related U.S. Application Data

(60) Provisional application No. 62/096,262, filed on Dec. 23, 2014, provisional application No. 62/096,135, filed on Dec. 23, 2014.

(51) Int. Cl.
*G06F 17/10* (2006.01)
*G06F 17/50* (2006.01)
*G06F 17/13* (2006.01)

(52) U.S. Cl.
CPC .......... *G06F 17/5009* (2013.01); *G06F 17/13* (2013.01)

(58) Field of Classification Search
CPC .................................................. G06F 17/5018
USPC ............................................................. 703/2
See application file for complete search history.

(56) References Cited

U.S. PATENT DOCUMENTS

| 7,987,145 B2* | 7/2011 | Baramov ............. G05B 13/048 706/21 |
| 9,074,896 B2* | 7/2015 | Mathews ............... G09B 23/10 |
| 2014/0201723 A1 | 7/2014 | Kapinski et al. |

FOREIGN PATENT DOCUMENTS

WO    WO2005093575 A1    10/2005

OTHER PUBLICATIONS

Angeli, David, "A Lyapunov Approach to Incremental Stability Properties," IEEE Transactions on Automatic Control, vol. 47, No. 3, pp. 410-421 (2002).
Angeli, David, "Further Results on Incremental Input-to-State Stability," IEEE Transactions on Automatic Control, vol. 54, No. 6, pp. 1386-1391 (Jun. 2009).

(Continued)

*Primary Examiner* — Andy Ho
(74) *Attorney, Agent, or Firm* — Lowenstein Sandler LLP

(57) ABSTRACT

A system and methods store initial states and unsafe states (e.g., safety requirements) of a non-linear model of a control system that interacts with a physical system. The system performs simulations of the non-linear model using a set of sampled initial states, to first generate trajectories (numerical approximations of actual behaviors) over bounded time. The system further determines, for respective pairs of neighboring trajectories: an over-approximation of reachable states as an upper bound of a distance between a pair of neighboring trajectories; a linear over-approximation of the reachable states as piece-wise linear segments over a plurality of time intervals; and whether the linear over-approximation overlaps in any of the piece-wise linear segments with the unsafe states, to verify the non-linear model of the control system is safe.

25 Claims, 10 Drawing Sheets

(56) References Cited

OTHER PUBLICATIONS

Angeli, David et al., "A Characterization of Integral Input-to State Stability," IEEE Transactions on Automatic Control, vol. 45, No. 6, pp. 1082-1097 (Jun. 2000).
Annapureddy, Yashwanth et al., "S-Taliro: A Tool for Temporal Logic Falsification for Hybrid Systems," Springer Berlin Heidelberg, pp. 254-257 (2001).
Aylward, Erin M. et al., "Stability and Robustness Analysis of Nonlinear Systems via Contraction Metrics and SOS Progamming," Autmatica, vol. 44, No. 8, pp. 2163-2170 (2008).
Bouissou, Oliver et al., "GRKLib: A Guranteed Runge Kutta Library," Scientific Computing, Computer Arithmetic and Validated Numerics, 12th GAMM-IMACS International Symposium, pp. 8-8 (2006).
"Computer Assisted Proofs in Dynamics Group," The CAPD group, 1 pg., accessed at http://www.capd.ii.uj.edu.pl/ on Mar. 7, 2016.
Chen, Xin et al., "Taylor Model Flowpipe Construction for Non-Linear Hybrid Systems," In Real-Time Systems Symposium (RTSS), pp. 183-192 (2012).
Donze, Alexandre, "Breach, A Toolbox for Verification and Parameter Synthesis of Hybrid Systems," Computer Aided Verification, pp. 167-170 (2010).
Duggirala, Parasara Sridhar et al., "Verification of Annotated Models from Executions," Proceedings of the Eleventh ACM International Conference on Embedded Software, p. 26 (2013).
Franzle, Martin et al., "HySAT: An Efficient Proof Engine for Bounded Model Checking of Hybrid Systems," Formal Methods in System Design, vol. 30, No. 3, pp. 178-198 (2007).
Frehse, Goran, "PHAVer: Algorithmic Verification of Hybrid Systems Past HyTech," In Hybrid Systems Computation and Control, pp. 258-273 (2005).
Frehse, Goran et al., "Space Ex: Scalable Verification of Hybrid Systems," In Computer Aided Verification, pp. 379-395 (2011).
Girard, Antoine et al., "Approximately Bisimilar Symbolic Models for Incrementally Stable Switched Systems," IEEE Transactions on Automatic Control, vol. 55, No. 1, pp. 116-126 (Jan. 2010).
Han, Zhi et al., "Towards Sensitivity Analysis of Hybrid Systems Using Simulink," Proceedings of the 16th International Conference on Hybrid Systems Computation and Control, pp. 95-100 (2013).
Huang, Zhenqi, "On Simulation Based Verification of Nonlinear Nondeterministic Hybrid Systems," Masters Thesis for the University of Illinois at Urbana-Champaign, pp. 1-62 (2013).
Huang, Zhenqi et al., "Computing Bounded Reach Sets from Sampled Simulation Traces," Proceedings of the 15th ACM International Conference on Hybrid Systems Computation and Control, pp. 291-294 (Apr. 2012).
Kaynar, Dilsun K. et al., "The Theory of Timed I/O Automata," Synthesis Lectures of Distributed Computing Theory, vol. 1, No. 1, pp. 1-130 (2010).
Khalil, H.K., "Nonlinear Systems," Prentice Hall, Third Edition, vol. 3, chapter 3, pp. 102-104 (1992).
Mitra, Sayan, "A Verification Framework for Hybrid Systems," Doctoral Dissertation, Massachusetts Institute of Technology, pp. 1-205 (2007).
Nedialkov, N. S. et al., "Validated Solutions of Initial Value Problems for Ordinary Differential Equations," Applied Mathematics and Computations, vol. 105, No. 1, pp. 21-68 (1999).
Pola, Giordano et al., "Approximately Bisimilar Symbolic Models for Nonlinear Control Systems," Automatica, vol. 44, No. 10, pp. 2508-2516 (2008).
Scardovi, Luca et al., "Synchronization in Networks for Identical Linear Systems," Automatic, vol. 45, pp. 2557-2562 (2009).
Sontag, Eduardo D., "Comments on Integral Variants of ISS," Systems & Control Letters, vol. 34, pp. 93-100 (1998).
Tabuada, Paulo et al., "Approximate Reduction of Dynamics Systems," Systems & Control Letters, vol. 57, pp. 538-545 (2008).
Wood, G. R. et al., "Estimation of Lipschitz Constant of a Function," Journal of Global Optimization, vol. 8, pp. 91-103 (1996).
Chen, Xin et al., "Flow: An Analyzer for Non-Linear Hybrid Systems," Computer Aided Verification, pp. 258-263 (2013).
Dreossi, Tommaso et al., "Efficient Guiding Strategies for Testing of Temporal Properties of Hybrid Systems," NASA Formal Methods, pp. 127-142 (2015).
Duggirala, Parasara Sridhar et al., "C2E2: A Verification Tool for Stateflow Models," Tools and Algorithims for the construction and Analysis of Systems, pp. 68-82 (2015).
Duggirala, Parasara Sridhar et al., "Temporal Precedence Checking for Switched Models and its Applicaiton to a Parallel Landing Protocol," Formal Methods, pp. 215-229 (2014).
"Eigen is a C++ Template Library for Linear Algebra: Matrices, Vectors, Numerical Solvers, and Related Algorithms," Eigen, pp. 1-12, accessed at http://eigen.tuxfamily.org/ on Mar. 7, 2016.
Jyotirmoy, Xiaoqing Jin et al., "Benchmarks for Model Transformations and Conformance Checking," 1st International Workshop on Applied Verification for Continuous and Hybrid Systems (ARCH), pp. 1-11 (2014).
Jin, Xiaoqing et al., "Powertrain Control Verification Benchmark," In proceedings of the 17th International Conference on Hybrid Systems, Computation and Control, pp. 253-262 (2014).
Jin, Xiaoqing et al., "Mining Requirements from Closed-Loop Control Models," IEEE Transactions on Computer-Aided Design of Integrated Circuits and Systems, vol. 34, No. 11, pp. 1704-1717 (Nov. 2015).
Jin, Xiaoqing, et al., "Mining Requirements from Closed-Loop Control Models, " Proceeding of the 16th International Conference on Hybrid Systems, Computation and Control, pp. 43-52 (2013).
Lohmiller, Winfried et al., "On Contraction Analysis for Non-Linear Systems," Automatic, vol. 34, No. 6, pp. 683-696 (1998).
Althoff, Matthias et al., "Reachability Analysis of Nonlinear Systems with Uncertain Parameters using Conservative Linearization," Proceedings of the 47th IEEE Conference on Decision and Control, pp. 4042-4048 (2008).
Bak, Stanley et al., "Computing Reachability for Nonlinear Systems with Hycreate," IEEE 16th International Conference on Hybrid Systems, 1 pg. (2013).
Dang, Thao et al., "Sensative State-Space Exploration," Proceedings of the 47th IEEE Conference On Decision and Control, pp. 4049-4054 (Dec. 9-11, 2008).
Dang, Thao et al., "Reachability Analysis via Face Lifting," Hybrid Systems Computation and Control, pp. 96-109 (1998).
Doneze, Alexandre et al., "Systematic Simulation Using Sensitivity Analysis," Hybrid Systems Computation and Control, pp. 174-189 (2007).
Duggirala, Parasara Sridhar et al. "Meeting a Powertrain Verification Challenge," Computer Aided Verification, pp. 536-543 (2015).
Fan, Chuchu et al., "Progress on Powertrain Verification Challenge with C2E2," ARCH, pp. 1-7 (2015).
Huang, Zhenqi et al. "Proofs from Simulations and Modular Annotations," Proceedings of the 17th International Conference on Hybrid Systems, Computation and Control, pp. 183-192 (2014).
Huang, Zhenqi et al., "Invariant Verification of Nonlinear Hybrid Automata Networks of Cardiac Cells," Computer Aided Verification, pp. 373-390 (Jul. 2014).
Islam, Md Ariful et al., "Model Checking Tap Withdrawal in C. Elegans," Hybrid Systems Biology, pp. 195-210 (2015).
Julius, A. Agung et al., "Trajectory Based Verification Using Local Finite-Time Invariance," Hybrid Systems, Computation and Control, pp. 223-236 (2009).
Nedialkov, Nedialko S., "VNODE-LP A Validated Solver for Initial Value Problems in Ordinary Differential Equations," Department of Computing and Software, pp. 1-218 (2006).
Sharma, B.B. et al., "Design of Asymptotically Convergent Frequency Estimator using Contraction Theory," Correspondence, IEEE Transactions on Automatic Control, vol. 53, No. 8, pp. 1932-1937 (Sep. 2008).
Zamani, Majid et al., "Symbolic Models for Nonlinear Control Systems without Stability Assumptions," IEEE Transactions on Automatic Control, vol. 57, No. 7, pp. 1804-1809 (Jul. 2012).

* cited by examiner

200

1: Input: $\Theta, U, T$
2: $\delta \leftarrow dia(\Theta); \epsilon \leftarrow \epsilon_0; C \leftarrow \emptyset, \mathcal{R} \leftarrow \emptyset$; //$\epsilon_0$ is a small constant
3: $C \leftarrow (Partition(\Theta, \delta), \delta, \epsilon)$
4: while $C \neq \emptyset$ do
5:   for $(\theta, \delta, \epsilon) \in C$ do
6:     $\psi \leftarrow Simulate(\theta, \tau, \epsilon, T)$
7:     $\beta \leftarrow ComputeLDF(\psi, J_f, L_f, \delta, \epsilon)$
8:     $D \leftarrow \psi \oplus \beta$
9:     if $D \cap U = \emptyset$ then
10:       $C \leftarrow C \setminus \{(\theta, \delta, \epsilon)\}; \mathcal{R} \leftarrow \mathcal{R} \cup D$
11:     else if $\exists k, R_k \subseteq U$ then
12:       return (UNSAFE, $\mathcal{R}$)
13:     else
14:       $C \leftarrow C \setminus \{(\theta, \delta, \epsilon)\}$
15:       $C \leftarrow C \cup Partition(\Theta \cap B_\delta(\theta), (\frac{\delta}{2}, \ldots, \frac{\delta}{2}), \frac{\epsilon}{2})$
16:     end if
17:   end for
18: end while
19: return (SAFE, $\mathcal{R}$)

1: Input: $\psi, J_f, L_f, \delta, \epsilon$
2: $\Delta \leftarrow \delta, b \leftarrow zeros(k)$
3: for i = 1:k do
4: $\quad \tau \leftarrow t_i - t_{i-1}$
5: $\quad d \leftarrow (\Delta + \epsilon)e^{L_f \tau}$
6: $\quad S \leftarrow hull(R_{i-1}, R_i) \oplus B_d(0)$
7: $\quad J \leftarrow J_f(center(S))$
8: $\quad \lambda \leftarrow \max(eig(J + J^T)/2)$
9: $\quad error \leftarrow \max_{x \in S} \|(J_f(x) + J_f^T(x)) - (J + J^T)\|$
10: $\quad b[i] \leftarrow \lambda + error/2$
11: $\quad \Delta \leftarrow (\Delta + \epsilon)e^{b[i]\tau}$
12: end for
13: return $b$

*FIG. 3*

| | example | dim | δ | U | #Sim | LDF(s) | #SimO | LDFO(s) | flow*(s) | HyCreate(s) |
|---|---|---|---|---|---|---|---|---|---|---|
| 1 | Vanderpol | 2 | 0.5 | x>2.0 | 9 | 0.378 | 61 | 2.01 | 11.2 | 2.776 |
| 2 | Brusselator | 2 | 0.5 | x>1.3 | 21 | 1.01 | 85 | 2.79 | 11.8 | 1.84 |
| 3 | Jet Engine | 2 | 0.4 | x>2.0 | 5 | 0.353 | 61 | 1.97 | 8.74 | 5.54 |
| 4 | Robot arm | 4 | 0.5 | x>2.5 | 81 | 4.60 | 1159 | 47.9 | 169 | >300 |
| 5 | CoupledVanderpol | 4 | 0.5 | x>2.0 | 41 | 2.21 | 1353 | 54.2 | 93 | 49.8 |
| 6 | Sinusoidal Tracking | 6 | 0.5 | x>10 | 185 | 13.2 | 753 | 97.0 | 258 | >300 |
| 7 | Lorenz Attractor | 3 | 0.02 | x>1e4 | 573 | 13.99 | 3106 | 72.0 | 53.4 | N/A |
| 8 | Fixed-wing UAV (T=10) | 7 | 3 | x>30 | 321 | 20.8 | N/A | N/A | N/A | N/A |
| 9 | Helicopter | 28 | 0.02 | x>4 | 585 | 67.7 | N/A | N/A | N/A | N/A |
| 10 | Fixed-wing UAV (T=50) | 7 | 3 | x>30 | 321 | 99.8 | N/A | N/A | N/A | N/A |
| 11 | Fixed-wing UAV (T=100) | 7 | 3 | x>30 | 321 | 196 | N/A | N/A | N/A | N/A |

*FIG. 4*

|   | $\delta$ | U | saftey | #Sim | dia | RT(s) |
|---|---|---|---|---|---|---|
| 1 | 0.6 | $\theta > 3$ | safe | 17 | 5.6e-3 | 0.948 |
| 2 | 0.4 | $\theta > 3$ | safe | 9 | 3.6e-3 | 0.598 |
| 3 | 0.3 | $\theta > 3$ | safe | 9 | 2.6e-3 | 0.610 |
| 4 | 0.2 | $\theta > 3$ | safe | 5 | 1.8e-3 | 0.444 |
| 5 | 0.1 | $\theta > 3$ | safe | 1 | 1.5e-3 | 0.271 |
| 6 | 0.2 | $\theta > 2.5$ | safe | 9 | 1.7e-3 | 0.609 |
| 7 | 0.2 | $\theta > 2.18$ | safe | 17 | 1.4e-3 | 0.933 |
| 8 | 0.2 | $\theta > 2.17$ | safe | 29 | 1.0e-3 | 1.429 |
| 9 | 0.2 | $\theta > 2.15$ | safe | 161 | 9.2e-4 | 6.705 |
| 10 | 0.2 | $\theta > 2.14$ | unsafe | 45 | N/A | 1.997 |
| 11 | 0.2 | $\theta > 2.13$ | unsafe | 35 | N/A | 1.625 |
| 12 | 0.2 | $\theta > 2.1$ | unsafe | 1 | N/A | 0.267 |

*FIG. 5*

|   | $\delta$ | U | #Sim | RT(s) |
|---|---|---|---|---|
| 1 | 50 | $H > 400$ | 24001 | 1518 |
| 2 | 46 | $H > 400$ | 6465 | 415 |
| 3 | 40 | $H > 400$ | 257 | 16.33 |
| 4 | 36 | $H > 400$ | 129 | 8.27 |
| 5 | 20 | $H > 400$ | 1 | 0.237 |

```
Algorithm 1: Verifying interconnecting systems
   input: A, U, ϵ₀, δ₀, T, {Vᵢ, αᵢ, ᾱᵢ, βᵢ, γᵢⱼ}
 1  δ ← δ₀; ϵ ← ϵ₀; R ← ∅;
 2  C ← Partition(Θ_A, δ, ϵ);
 3  while C ≠ ∅ do
 4    for (θ, δ, ϵ) ∈ X do
 5      M ← ISApprox(δ, {Vᵢ, αᵢ, ᾱᵢ, βᵢ, γᵢⱼ});
 6      ψ ← Simulate(A, θ, T, ϵ, τ);
 7      φ ← Simulate(M, θ_M, T, ϵ, τ);
 8      ρ ← SupByTime(φ);
 9      S ← B^V_ρ(ψ);
10      if S ∩ U = ∅ then
11        | C ← C\{(θ, δ, ϵ)}; R ← R ∪ S ;
12      else if ∃k, B^V_{rₖ}(Rₖ) ⊆ U then
13        | return (UNSAFE, R)
14      else
15        | C ← C\{(θ, δ, ϵ)};
16        | C ← C ∪ Partition(Θ ∩ B_δ(θ), (δ₁/2, ..., δ_N/2), ϵ/2);
17      end
18    end
19  end
20  return (SAFE, R);
```

*FIG. 10*

| System | # V | # N | # C | # sim | RT (s) |
|---|---|---|---|---|---|
| Lin. Sync I | 12 | 3 | 128 | 42112 | 115.7 |
| Lin. Sync II | 16 | 4 | 128 | 45440 | 129.2 |
| Lin. Sync III | 24 | 6 | 128 | 45649 | 135.1 |
| Nonli. WT I | 10 | 2 | 128 | 45184 | 127.4 |
| Nonli. WT II | 15 | 3 | 128 | 47232 | 134.9 |
| Nonli. WT III | 30 | 6 | 128 | 47232 | 140.0 |
| Nonli. Rob. I | 6 | 2 | 64 | 22592 | 49.3 |
| Nonli. Rob. II | 6 | 2 | 216 | 76248 | 166.8 |

*FIG. 11*

BOUNDED VERIFICATION THROUGH DISCREPANCY COMPUTATIONS

REFERENCE TO EARLIER FILED APPLICATION

This application claims the benefit under 35 U.S.C. § 119(e) of U.S. Provisional Patent Application No. 62/096,262, filed Dec. 23, 2014, and of U.S. Provisional Patent Application No. 62/096,135, filed Dec. 23, 2014, both of which are incorporated herein, in its entirety, by this reference.

FEDERALLY SPONSORED RESEARCH

This invention was made with government support under CNS 1422798 awarded by National Science Foundation and FA9550-12-1-0336 awarded by Air Force Office of Scientific Research. The government has certain rights in the invention.

BACKGROUND

Simulation-based verification algorithms can provide formal safety guarantees for nonlinear and hybrid systems. Most models that are constructed by engineers in the process of designing systems are in fact nonlinear. The hybrid aspect arises when there is a switch from one nonlinear model to a different nonlinear model, owing to, for example, changes in the environment, user inputs, or failures.

For nonlinear dynamical systems that do not admit analytic solutions, one relies exclusively on numerical simulations. Though simulations give sufficient confidence for design, testing, and performance analysis in many application scenarios, for mathematical guarantees or verification, simulations are of limited use. Particularly resistant to simulation-based verification are nonlinear models with large sets of initial conditions, inputs, and unknown parameters.

Previous algorithms rely on user provided model annotations called discrepancy functions, which are used for computing reachtubes from simulations. A reachtube is a mathematical construct of over-approximations to capture all possible behaviors that can arise from inputs and initial states of a simulation of a physical system.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 2 is a flow chart of a verification algorithm according to an embodiment of the present disclosure.

FIG. 3 is flow chart of an algorithm for computing a local discrepancy function according to an embodiment of the present disclosure.

FIG. 4 is a table with safety verification results of the algorithms of FIGS. 2 and 3 compared against benchmark examples.

FIG. 5 is a table depicting safety verification results for a robot arm with different initial states and unsafe sets, according to an embodiment of the present disclosure.

FIG. 6 is a table of safety verification results for a fixed-wing unmade aerial vehicle (UAV) with large initial sets, according to an embodiment of the present disclosure.

FIG. 10 is a flow chart of an algorithm for verifying an interconnecting system, according to an embodiment of the present disclosure.

FIG. 11 is a table depicting experiments results from implementing the algorithm of FIG. 10, according to an embodiment of the present disclosure.

DETAILED DESCRIPTION

Figure 1:
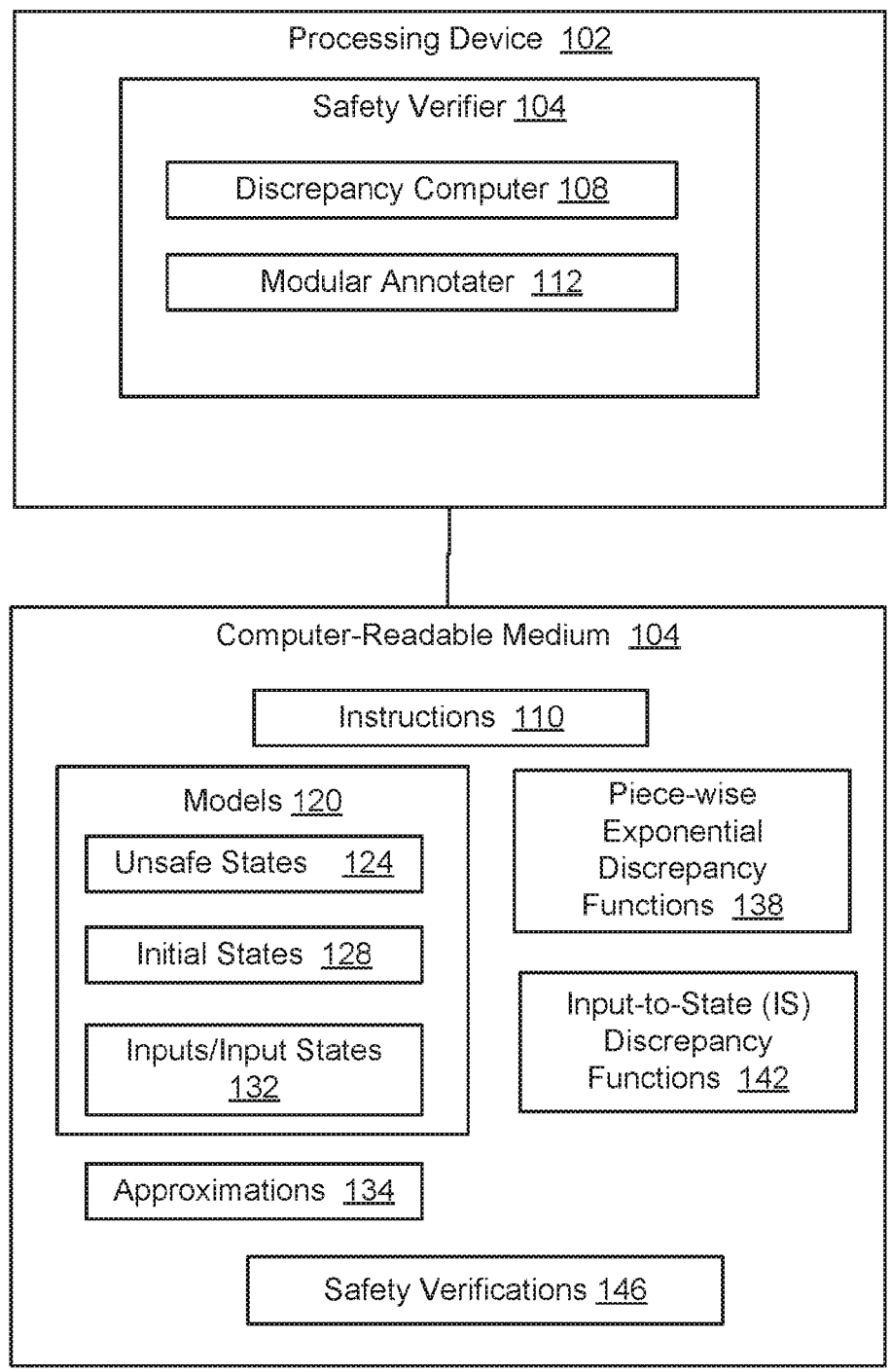
FIG. 1 is a system diagram of a system according to an embodiment of the present disclosure.

By way of introduction, the present disclosure relates to bounded verification with various ways of integrating computation of discrepancy functions to verify safety of a large, non-linear and possibly hybrid model of a control system interacting with a physical process (or plant). Limited simulations may be used to verify safety of the overall physical system. In one embodiment, a non-input-to-state (non-IS) method determines a local discrepancy function of a larger system that nonetheless verifies safety of the larger system. In another embodiment, the non-IS discrepancy function of a subsystem is turned into an input-to-state (IS) discrepancy function that can be combined with IS discrepancy function(s) of other subsystem(s) of the overall model, where safety can be verified from a reduced-sized model that is constructed from these IS discrepancy functions. In yet another embodiment, IS discrepancy functions of each of multiple subsystems are received and from which verification of the system can be performed, again without needing IS discrepancy functions of all the subsystems that make up the larger system.

For example, in one embodiment, a system includes processing device and non-transitory, computer-readable medium storing a set of initial states and a set of unsafe states (e.g., that satisfy safety requirements) of non-linear model of a control system that is to (or interacts) with a physical system, and further storing the model and the instructions. Herein, "non-linear" also is considered "hybrid," or a model that is in part non-linear. The processing device is to execute the instructions to compute a piece-wise, exponential discrepancy function of the non-linear model including performing a simulation of the model using a set of sampled states from the set of initial states, to generate a plurality of trajectories over bounded time, wherein a trajectory is a set of numerical approximations of system behaviors. The processing device is further to determine, for respective pairs of neighboring trajectories from the plurality of trajectories: an over-approximation of reachable states as an upper bound of a distance between a pair of neighboring trajectories, wherein the distance approaches zero ("0") as initial states of the pair of neighboring trajectories approach each other; a linear over-approximation of the reachable states as piece-wise linear segments over a plurality of time intervals; and whether the linear over-approximation overlaps in any of the piece-wise linear segments with the unsafe states, to verify the non-linear model of the control system is safe.

The present disclosure eliminates the requirement that users provide discrepancy functions by presenting an algorithm for computing piecewise exponential discrepancy functions of a model of a control system that is to interact (or interacts) with a physical system. The algorithm relies on computing local convergence or divergence rates of trajectories along a simulation using a coarse over-approximation of the reach set and bounding the maximal eigenvalue of the Jacobian over this over-approximation. The resulting discrepancy function preserves the soundness and the relative completeness of the verification algorithm. A coordinate transformation on the reachable states can improve the local estimates for the convergence or divergence rates in practical examples. The method is extended to get the IS discrepancies of nonlinear dynamical systems that can be used for compositional analysis. Our experiments show that the approach is effective in terms of running time for several benchmark problems, scales reasonably to larger dimensional systems, and compares favorably with respect to available tools for nonlinear models.

FIG. 1 is a system diagram of a system 100 according to an embodiment of the present disclosure. The system 100 can be a special purpose computing device configured to perform the methods and procedures disclosed herein. In particular, the system can include a processing device 102 to execute logic, to include a safety verifier 104 that in turn includes a discrepancy computer 108 and a modular annotater 112. The discrepancy computer 108 can compute piece-wise exponential discrepancy functions 138 as well as input-to-state (IS) discrepancy functions 142, both which can be stored in a computer-readable medium 104. The modular annotater 112 can compute a low-dimensional deterministic dynamical system from a smaller set of IS discrepancy functions than all possible IS discrepancy functions of a non-linear dynamical system. A dynamical system includes interacting subsystems that makeup the larger system.

With further reference to FIG. 1, the system 100 includes a computer-readable medium 104 in which is stored instructions 110, a models 120 of non-linear, physical systems, numerical approximations 134 of reachable states of those physical systems, the piece-wise exponential discrepancy functions 138, IS discrepancy functions 142 and safety verifications 146 for the physical systems. The piece-wise exponential discrepancy function may be determined from an appropriately bounded reachtube that allows for verification of reachable states.

The models 120 can include a set of unsafe states 124 or other criteria that informs unacceptable behavior of a non-linear physical system. In industry terms, safety requirements for a physical system, as modeled, can be embodied in or specified by the set of unsafe states 124. The models 120 can further include a set of initial states 128 and inputs or input states 132. One or more IS discrepancy functions can, in one embodiment, be related to a piece-wise exponential discrepancy function as will be explained. In determining an IS discrepancy function 142 for a subsystem, the processing device 102 can process inputs or input states form one or more other subsystems, to determine an IS discrepancy function for each of multiple subsystems that make up a larger system. By combining multiple IS discrepancy functions into a low dimensional deterministic dynamical system, safety verification can be effectively carried out on the physical system without verifying each possible IS discrepancy function.

Verifying and falsifying nonlinear, switched, and hybrid system models using numerical simulations have been studied in detail. The bounded time safety verification problem for a given model is parameterized by a time bound, a set of initial states, and a set of unsafe states and requires one to decide whether there exists a behavior of the model that reaches any unsafe set from any initial state. The simulation-based procedure, executed on a computing system such as that of FIG. 1, for this problem can first generate a set of numerical approximations of the behaviors from a finite sampling of the initial states. Next, by applying a discrepancy function to these simulations with an appropriately large factor (also referred to as bloating), the procedure computes an over-approximation of the reachable states from the initial set. If this over-approximation proves safety or produces a counter-example, then the algorithm decides whether to terminate; otherwise, the procedure draws more samples of initial states and repeats the earlier steps to compute a more precise over-approximation. With post-processing of the reachtube over-approximations, the disclosed procedure can be utilized to verify temporal precedence and richer classes of properties.

In order to make this type of procedure sound, the discrepancy function should be chosen to be large. Specifically, it should be large enough to make each bloated simulation an over approximation of the reachable states of the system not only from the sampled initial state, but also from a large enough neighborhood of that state so that the union of these neighborhoods cover the entire set of initial states. On the other hand, to make the procedure complete, or at least a relatively complete modulo of the precision of the machine, the procedure should be able to make the error due to bloating arbitrarily small for any point in time. These two opposing requirements are captured in the discrepancy function, e.g., for an n-dimensional dynamical system, it is any function $\beta: R^{2n} \times R^{\geq 0} \to R^{\geq 0}$, such that (a) it gives an upper-bound on the distance between any two trajectories $\xi(x,t)$ and $\xi'(x,t)$ of the system $|\xi(x,t)-\xi(x',t)| \leq \beta(x, x',t)$, and (b) it vanishes as x approaches x'. Simply using the Lipschitz constant of the dynamic function gives one such bound, the Lipschitz constant it grows exponentially with time even for some incrementally stable models.

The notion of a contraction metric can give a much tighter bound and provide heuristics for finding discrepancy functions for some classes of polynomial systems. Sensitivity analysis approaches give strict error bounds for linear systems, but for nonlinear models the bounds are less clear. The present disclosure fills this gap by providing a subroutine, executable by a computing system such as that of FIG. 1, that computes a local version of the discrepancy function that is adequate and effective for sound and relatively complete simulation-based verification of more general nonlinear systems. This subroutine, ComputeLDF, itself uses a Lipschitz constant and the Jacobian of the dynamic function (the right hand side of the differential equation) and simulations of the system. The Lispchitz constant is used to construct a coarse, one-step over-approximation of the reach set of the system along a simulation. The subroutine then computes an upper bound on the maximum eigenvalue of the symmetric part of the Jacobian over this over approximation, using a theorem from matrix perturbation theory.

These computations provide an exponential bound on the distance between two trajectories. The exponent can be the best it can be as it can be closest to the maximum eigenvalue of the linear approximation of the system in the neighborhood. One advantage of this scheme is that it is not necessary for the underlying system to have any special properties (such as incremental stability). In practice, ComputeLDF has been used successfully to verify a powertrain control model proposed as a challenge problem, and the model of a neural circuit in a multicellular organism, among others.

The present disclosure proposes two practical extensions of this approach. First, disclosed is that a linear coordinate transformation can bring about exponential improvements in the estimated distance. Secondly, proposed is a technique for computing input-to-state (IS) discrepancy functions for analyzing composed systems and systems with bounded nondeterministic inputs. The disclosure also reports the results from a number of experiments performed with a prototype implementation of this approach applied to safety verification.

For a vector $x \in \mathbb{R}^n$, $\|x\|$ is the $l^2$-norm of x and $x_i$ denotes its $i^{th}$ component. For $\delta \geq 0$, $B_\delta(x)=\{x' \in \mathbb{R}^n | \|x'-x\| \leq \delta\}$. For a set $S \subseteq \mathbb{R}^n$, $B_\delta(S) = \cup_{x \in S} B_\delta(x)$. Let $S \oplus B_\delta(0)$ represents the Minkowski sum of S and $B_\delta(0)$. Therefore, $S \oplus B_\delta(0) = B_\delta(S)$. For sets $S_1, S_2 \subseteq \mathbb{R}^n$, hull$(S_1, S_2)$ is their convex hull. The diameter of a compact set S is dia(S)=$\sup_{x_1, x_2 \in S}\|x_1-x_2\|$.

A continuous function $f: \mathbb{R}^n \to \mathbb{R}$ is smooth when all its higher derivatives and partial derivatives exist and are also continuous. The continuous function has a Lipschitz constant $L \leq 0$ if, for every x, $x' \in \mathbb{R}^n$, $\|f(x)-f(x')\| \leq L\|x-x'\|$. A function $f: \mathbb{R}^{\geq 0} \to \mathbb{R}^{\leq 0}$ is a class K function if it is continuous, strictly increasing, and $f(0)=0$.

Given a differentiable vector-valued function $f: \mathbb{R}^n \times \mathbb{R}^{\geq 0} \to \mathbb{R}^n$, the Jacobian $J_f$ of $f$ is the matrix-valued function of the first-order partial derivatives of $f$. Let $f_i = 1 \ldots n: \mathbb{R}^n \to \mathbb{R}_{\geq 0}$ be the scalar components of $f$. The Jacobian of $f$ is:

$$(J_f(x))_{ij} = \frac{\partial f_i(x)}{\partial x_j}.$$

The symmetric part of the Jacobian of $f$ matrix can be expressed as $\frac{1}{2}(J_f(x)+J_f^T(x))$.

For an n×n matrix A, $\|A\|$ represents the $l^2$-norm of A: $\|A\|=\sqrt{\lambda_{max}(A^HA)}$. $A^H$ is the conjugated transpose of A, and $\lambda_{max}(A)$ is the largest eigenvalue of matrix A. When A is a real matrix, we write it as $A^T$. If $\forall x \in \mathbb{R}^n$, $x^T A x \leq 0$, then we say A is negative-semidefinite, and write $A \preceq 0$. We write $A \preceq 0$ if $A-B \preceq 0$.

Safety Verification.

Consider an autonomous dynamical system:

$$\dot{x}=f(x), \quad (1)$$

where $f: \mathbb{R}^n \to \mathbb{R}^n$ is a Lipschitz continuous function. A solution or a trajectory of the system is a function $\xi: \mathbb{R}^n \times \mathbb{R}^{\geq 0} \to \mathbb{R}^n$ such that for any initial point $x_0 \in \mathbb{R}^n$ and at any time $t \geq 0$, $\xi(x_0,t)$ satisfies the differential equation (1).

The bounded-time safety verification problem is parameterized by: (a) an n-dimensional dynamical system, that is, the function $f$ defining the right hand side of its differential equation, a compact set $\Theta \subseteq \mathbb{R}^n$ of initial states, an open set $U \subseteq \mathbb{R}^n$ of unsafe states, and a time bound $T>0$. A state x in $\mathbb{R}^n$ is reachable from $\Theta$ within a time interval $[t_1,t_2]$ if there exists an initial state $x_0 \in \Theta$ and a time $t \in [t_1,t_2]$ such that $x=\xi(x_0,t)$. The set of all reachable states in the interval $[t_1,t_2]$ is denoted by Reach $(\Theta,[t_1,t_2])$. If $t_1=0$, then we write Reach$(t_2)$ when set $\Theta$ is clear from the context. Given a bounded-time safety verification problem, we would like to design algorithms for deciding if any reachable state is safe, that is, if Reach(T)$\cap$ U=$\emptyset$. If there exists some $\varepsilon>0$ such that $B_\varepsilon$(Reach(T))$\cap$ U=$\emptyset$, we say the system is robustly safe. In the remainder of this section, we present an overview of a verification algorithm 200 (FIG. 2) to solve this problem for a broad class of nonlinear dynamical, switched, and hybrid systems.

Simulations, Reachtubes and Annotations.

The verification algorithm uses simulation oracles that give sampled numerical simulations of the system from individual initial states.

Definition 3.1.

A $(x_0,\tau,\varepsilon,T)$-simulation of the system described in Equation (1) is a sequence of time-stamped sets $(R_0,t_0)$, $(R_1,t_1) \ldots, (R_n,t_n)$ satisfying:
1. Each $R_i$ is a compact set in $\mathbb{R}^n$ with dia$(R_i) \leq \varepsilon$.
2. The last time $t_n=T$ and for each i, $0 < t_i - t_{i-1} \leq \tau$, where the parameter $\tau$ is called the sampling period.
3. For each $t_i$, the trajectory from $x_0$ at $t_i$ is in $R_i$, i.e., $(x_0,t_i) \in R_i$, and for any $t \in [t_{i-1},t_i]$, the solution $\xi(x_0,t) \in$ hull $(R_{i-1},R_i)$.

Simulation engines generate a sequence of states and error bounds using numerical integration. Libraries like CAPD and VNODE-LP compute such simulations for a wide range of nonlinear dynamical system models and the $R_i$'s are represented by some data structure like hyperrectangles.

Closely related to simulations are reachtubes. For a set of states $D \subseteq \mathbb{R}^n$, a $(D,\tau,T)$-reachtube of (1) is a sequence of time-stamped sets $(R_0,0)$, $(R_1,t_1) \ldots, (R_n,t_n)$ satisfying:
1. Each $R_i \subseteq \mathbb{R}^n$ is a compact set of states.
2. The last time $t_n=T$ and for each i, $0 \leq t_i-t_{i-1} \leq \tau$.
3. For any $x_0 \in D$, and any time $t \in [t_{i-1},t_i]$, the solution $\xi(x_0,t) \in R_i$.

A reachtube is analogous to a simulation from a set of states, but they are much harder to compute. In fact, an algorithm for computing exact reachtubes readily solves the safety verification problem.

Previous deployed algorithms require the user to decorate the model with annotations called discrepancy functions for computing reachtubes.

Definition 3.2.

A continuous function $\beta: \mathbb{R}^n \times \mathbb{R}^n \times \mathbb{R}^{\geq 0} \to \mathbb{R}^{\geq 0}$ is a discrepancy function of the system in Equation (1) when
1. for any x, $x' \in \mathbb{R}^n$, and any time $t>0$, $\|\xi(x,t)-\xi(x',t)\| \leq \beta(x,x',t)$, and
2. for any t, as $x \to x'$, $\beta(.,.,t) \to 0$, If the function $\beta$ meets the two conditions for any pair of states x, x' in a compact set K instead of $\mathbb{R}^n$, then it is called a K-local discrepancy function. Uniform continuity means that $\forall \varepsilon > 0$, $\forall x, x' \in K$, $\exists \delta$ such that for any time $$t, \|x-x'\| < \delta \Rightarrow \beta(x,x',t) < \varepsilon.$$

The annotation $\beta$ gives an upper bound on the distance between two neighboring trajectories as a function of their initial states and time. Unlike incremental stability conditions, the second condition on $\beta$ does not require the trajectories to converge as time goes to infinity, but only as the initial states converge. Accordingly, if the function $f$ has a Lipschitz constant L, then $\beta(x,x',t)=\|x-x'\|e^{Lt}$ meets the above criteria. Other heuristics have been proposed for finding discrepancy functions. As will be clear from the following discussion, the quality of the discrepancy function strongly influences the performance of the simulation-based verification algorithm. Other approaches need user-provided discrepancy and simulation engines to give verification of bounded time safety and temporal precedence properties. In this disclosure, we will present approaches for computing local discrepancy functions that unburdens the user from finding these annotations.

Verification Algorithm

The simulation-based verification algorithm 200 is shown in FIG. 2. It takes as input some finite description of the parameters of a safety verification problem, namely, the function $f$, the initial set $\Theta$, the unsafe set U, and the time bound T. The verification algorithm has two main data structures: (i) C returned by function Partition, is a collection of triples $<\theta,\delta,\varepsilon>$ such that the union of all the $\delta$-balls around the $\theta$'s completely cover the initial set $\Theta$; and (ii) R incrementally gets the bounded-time reachtube from $\Theta$. Initially, C has a singleton cover $<\theta_0,\delta_0,\varepsilon_0>$ such that $\delta_0$=dia$(\Theta)$, $\Theta \subseteq B_{\delta_0}(\theta_0)$, and $\varepsilon_0$ is a small constant for simulation precision.

In the while-loop, the verification algorithm iteratively refines the cover of $\Theta$ and for each $<\theta, \delta,\varepsilon>$ in C and computes over-approximations of the reachtube from $B_\delta(\theta)$. The higher-level structure of the algorithm works as follows. When the reachtube from $B_\delta(\theta)$ proves to be safe, e.g., disjoint from U, then the corresponding triple is removed from C (Line 10). If part of the simulation from $\theta$ overlaps with U, then the system is declared to be unsafe (Line 12). Otherwise, a finer cover of $B_\delta(\theta)$ is created, and the corresponding triples with finer parameters are added to C.

Here we discuss the reachtubes computed from discrepancy and simulations. For each $<\theta,\delta,\varepsilon>$ in C, a $(\theta,\tau,\varepsilon,T)$-simulation $\psi$, which is a sequence of $\{(R_i,t_i)\}$, is generated. Note that $\psi$ contains the trajectory from $\theta$, $\xi(\theta,t),t\in[0,T]$. Then we bloat each $R_i$ by some factor (Line 8) such that the resulting sequence contains the reachtube from $B_\delta(\theta)$. It is shown that this bloated simulation is guaranteed to be an over-approximation of Reach($B_\delta(\theta)$,T) and the union of these bloated simulations is an over-approximation of Reach$(\Theta,T)$. The algorithm is therefore sound. Furthermore, the second property of $\beta$ ensures that the reach set over-approximations become tighter and tighter as we make $\delta$ smaller and smaller. Finally, the verification algorithm returns "SAFE" for robustly safe reachtubes or find a counter example and return "UNSAFE." For a user-defined discrepancy function, the factor is obtained by maximizing $\beta(\theta,\tilde{\theta},t)$ over $\tilde{\theta} \in B_\delta(\theta)$ and $t \in [t_{i-1},t]$. Herein, we analyze in detail the ComputeLDF subroutine which automatically computes a local version of the discrepancy function.

Theorem 3.3.

The verification algorithm 200 of FIG. 2 is sound, e.g., if it returns "SAFE" then the system is safe; when it returns "UNSAFE," there exists at least one execution from $\Theta$ that is unsafe. It is relatively complete, e.g., if the system is robustly safe, it will terminate and return "SAFE." If any execution from $\Theta$ is unsafe, the verification algorithm terminates and returns "UNSAFE."

Local Discrepancy Function

In this section, we present the ComputeLDF algorithm and its analysis. This algorithm computes a special type of local discrepancy in terms of time-varying exponential functions that bound from above the distance between two trajectories starting from a compact neighborhood. Roughly speaking, ComputeLDF computes the rate of trajectory convergence or divergence for an interval of time instances.

Definition 4.1.

Consider a compact set $C \subseteq R^n$ and a sequence of time points $0=t_0<t_1<t_2<\ldots<t_k=T$. For $\forall x_1,x_2 \in C$, $\forall t \in [0,T]$, a piecewise exponential discrepancy function $\beta$: $C \times C \times [0,T] \to R^{\geq 0}$ can be expressed as:

$$\beta(x_1, x_2, t) = \begin{cases} \|x_1 - x_2\|, & \text{if } t = t_0, \\ \beta(x_1, x_2, t_{i-1})e^{b[i](t-t_{i-1})}, & \text{if } t \in (t_{i-1}, t_i], \end{cases} \quad (2)$$

where b[1], . . . , b[k] are real constants.

From the definition, we can immediately get that $$\beta(x_1, x_2, t) = \|x_1 - x_2\| e^{b[i](t-t_{i-1}) + \sum_{j=1}^{i-1} b[j](t_j - t_{j-1})},$$
$$i = 1, \ldots, k,$$

where $t_{i-1}$ is the largest time point in the sequence before t.

ComputeLDF Algorithm

FIG. 3 shows the pseudocode for the ComputeLDF algorithm (or subroutine) 300 used in Line 7 of the verification algorithm 200 of FIG. 2. ComputeLDF takes as input a parameter $\delta$, an error bound for simulation $\varepsilon$, the Lipschitz constant $L_f$, the Jacobian matrix $J_f$ of function $f$ and a $(\theta,\tau,\varepsilon,T)$-simulation $\psi=\{(R_i,t_i)\}$, i=0,1, . . . , k. ComputeLDF computes a piecewise, exponential local discrepancy function (LDF) for the compact set $B_\delta(R_0)$ and for the time points $t_0, \ldots, t_k$, and returns the LDF as an array of exponential coefficients b.

The ComputeLDF algorithm starts with the initial set $B_\delta(R_0)$ and with $\Delta=\delta$. In each iteration of the for-loop, the ComputeLDF algorithm computes exponent b[i] corresponding to the time interval $[t_{i-1},t_i]$. In the $i^{th}$ iteration, $\Delta$ is updated so that $B_\Delta(R_{i-1})$ is an over-approximation of the reachable states from $B_\delta(R_0)$ at $t_{i-1}$ (Lemma 4.8). In Lines 5 and 6, a set S is computed by bloating the convex hull hull$(R_{i-1},R_i)$ by a factor of $d=(\Delta+\varepsilon)e^{L_f(t_i-t_{i-1})}$. The set S will later be proved to be a (coarse) over-approximation of the reachtube from $B_\Delta(R_{i-1})$ over the time interval $[t_{i-1},t_i]$ (Lemma 4.2). In Lines 7-10, an upper bound on the maximum eigenvalue of the symmetric part of the Jacobian over the set S is computed as b[i] (Lemma 4.6). Then $\Delta$ is updated as $(\Delta+\varepsilon)e^{b[i](t_i-t_{i-1})}$ for the next iteration.

Analysis of ComputeLDF

In this section, we will prove that ComputeLDF($\psi$,$J_f$,$L_f$, $\delta,\varepsilon$) returns a piecewise exponential LDF of the system in Equation (1), for the compact neighborhood $B_\delta(R_0)$, and the sequence of the time points in the simulation $\psi$. We establish some lemmas to prove the main theorem. First, we show in Lemma 4.2 that in the $i^{th}$ iteration of the loop, the computed S is an over-approximation of the set of states that can be reached by the system from $B_\Delta(R_{i-1})$ over the time interval $[t_{i-1},t_i]$.

Lemma 4.2.

In the $i^{th}$ iteration of ComputeLDF, Reach$(B_\Delta(R_{i-1}),[t_{i-1}, t_i]) \subseteq S$. Lemma 4.2 shows that, using Lipschitz constant and Gronwall's inequality, we can get an one-step over-approximation of the reachtube.

Next, using the generalized mean value theorem (Lemma 4.3), we get that in the $i^{th}$ iteration, the computed b[i] in Line 10 is the exponential divergence (if positive) or convergence (negative) rate of the distance between any two trajectories starting from $B_\Delta(R_{i-1})$ over time $[t_{i-1},t_i]$.

Lemma 4.3.

For any continuously differentiable vector-valued function $f: R^n \to R^n$, and $x, r \in R^n$, $f(x+r)-f(x)=(\int_0^1 J_f(x+sr)ds) \cdot r$, where the integral is component-wise.

Next, we will use a well-known theorem that gives bounds on eigenvalues of perturbed symmetric matrices, the proof of which uses the Courant-Fischer minimax theorem.

Theorem 4.4.

If A and E are n×n symmetric matrices, then $$\lambda_n(E) \leq \lambda_k(A+E) - \lambda_k(A) \leq \lambda_1(E),$$

where $\lambda_i(\cdot)$ is the $i^{th}$ largest eigenvalue of a matrix.

Corollary 4.5.

If A and E are n×n symmetric matrices, then $$|\lambda_k(A+E) - \lambda_k(A)| \leq \|E\|. \quad (3)$$

Since A is symmetric, $\|A\| = \sqrt{\lambda_{max}(A^T A)} = \max(|\lambda(A)|)$. From Theorem 4.4, we have $|\lambda_k(A+E)-\lambda_k(A)| \leq \max\{|\lambda_n(E)|, |\lambda_1(E)|\} = \|E\|$. If $E(x)$ is a matrix-valued function: $R^n \to R^{n \times n}$ maps a state $x \in R^n$ to a matrix $E(x)$, and every component of $E(x), e_{ij}(x): R^n \to R$ is continuous over some compact closed set S, then we can get an upper bound of $\|E(x)\|$ over S by computing the upper bound of the absolute value of each term $e_{ij}(x)$, $|e_{ij}(x)|$ over S. Let $\max_{x \in S}(|e_{ij}(x)|)$ be denoted by $\tilde{e}_{ij}$, then we know $\max_{x \in S} \|E(x)\| \leq \sqrt{\sum_{i=1}^n \sum_{j=1}^n \tilde{e}_{ij}^2}$. Because we assume the system to be Lipschitz continuous, the upper bound of the symmetric part of the Jacobian matrix in Line 9 always exists. Using Corollary 4.5, we next show in Lemma 4.6 that b[i] calculated in Line 10 bounds the eigenvalues of the symmetric part of Jacobian matrix over S.

Lemma 4.6.

In the $i^{th}$ iteration, for $\forall x \in S$: $J_f^T(x) + J_f(x) \preceq 2b[i]I$.

Proof.

Let S be the set computed in Line 6 and J be the Jacobian evaluated at the center $s_0$ of S. Consider any point $x \in S$. We define the perturbation matrix $E(x) \equiv J_f^T(x) + J_f(x) - (J^T + J)$. Since $J_f^T(x) + J_f(x)$ and $J^T + J$ are symmetric matrices, Corollary 4.5 implies that $\lambda_{max}(J_f^T(x)+J_f(x)) - \lambda_{max}(J^T+J) \leq \|E(x)\|$. The error term computed in Line 9 is the upperbound on $\|E(x)\|$. Therefore, $\lambda_{max}(J_f^T(x)+J_f(x)) \leq \lambda_{max}(J^T+J)+$error. In Line 10, set b[i] equal to $\lambda_{max}((J^T+J)/2)+$error/2. Thus, $\lambda_{max}(J_f^T(x)+J_f(x)) \leq 2b[i]$, which immediately indicates that $\forall x \in S: J_f^T(x) + J_f(x) \preceq 2b[i]I$.

By Lemma 4.3 and Lemma 4.6, we can prove as in Lemma 4.7 that b[i] calculated in Line 10 is the exponential rate of divergence or convergence of two trajectories starting from $B_\Delta(R_{i-1})$ over the interval $[t_{i-1}, t_i]$.

Lemma 4.7.

In the $i^{th}$ iteration, for any two states $x_1, x_2 \in B_\Delta(R_{i-1})$ at time $t_{i-1}$, and any time $t \in [t_{i-1}, t_i]$, $\|\xi(x_1,t)-\xi(x_2,t)\| \leq \|x_1-x_2\|e^{b[i](t-t_{i-1})}$.

This lemma can be deduced using Lemma 4.3. Up to this point, the lemmas were statements about a single iteration of the for-loop; next we show that in the $i^{th}$ iteration of the loop, $B_\Delta(R_i)$ used in Lemma 4.2 and 4.7, is the reach set from $B_\delta(R_0)$ at time $t_i$.

Lemma 4.8.

For $\forall i=1, \ldots, k$, Reach$(B_\delta(R_0),[t_i,t_i]) \subseteq B_{\Delta_i}(R_i)$, and Reach$(B_{\Delta_{i-1}}(R_{i-1}),[t_{i-1},t_i]) \subseteq \text{hull}(R_{i-1},R_i) \oplus B_{\Delta'_i}(0)$, where $\Delta_i$ is $\Delta$ after Line 11 is executed in the $i^{th}$ iteration, and $\Delta'_i = \max\{\Delta_i, \Delta_{i-1}+\varepsilon\}$.

Proof.

The lemma is proved by induction on i. First, we know that when $i=1$, Reach$(B_\delta(R_0),[t_0,t_0])=B_\delta(R_0)=B_{\Delta_0}(R_0)$. Then we will prove that $$\text{Reach}(B_\delta(R_0),[t_0,t_1]) \subseteq \text{hull}(R_0,R_1) \oplus B_{\max\{\Delta_1,\Delta_0+\varepsilon\}}(0),$$

using Lemma 4.7. Assuming that the lemma holds for $i=m-1$, we have Reach $(B_\delta(R_0),[t_{m-1},t_{m-1}]) \subseteq B_{\Delta_{m-1}}(R_{m-1})$. And, we will prove that the lemma holds for $i=m$ as well.

$\cup_{i=1}^k \{\text{hull}(R_{i-1},R_i) \oplus B_{\Delta'_i}(0)\}$ contains the $(B_\delta(R_0),\tau,T)$-reachtube of the system. Line 8 of the verification algorithm 200 (FIG. 2) can be computed in this way. Now we are ready to prove the main theorem.

Theorem 4.9.

The items in array b computed by the ComputeLDF algorithm 300 (FIG. 3) are the coefficients of a $B_\delta(R_0)$-local, piecewise exponential discrepancy function (Definition 4.1).

Proof.

First of all consider any time $t \in [t_0,t_1]$ and any two states: $x_1, x_2 \in B_\delta(R_0)$. By Lemma 4.7, $\|\xi(x_1,t)-\xi(x_2,t)\| \leq \|x_1-x_2\|e^{b[1](t-t_0)}$. Then, consider $t \in [t_1,t_2]$. By Lemma 4.8, we know at time $t_1$, $\xi(x_1,t_1)$ and $\xi(x_2,t_1)$ are contained in $B_{\Delta_1}(R_1)$, so we can use Lemma 4.7 such that for any time $t \in [t_1,t_2]$, $\|\xi(x_1,t)-\xi(x_2,t)\| \leq \|\xi(x_1,t_1)-\xi(x_2,t_1)\|e^{b[2](t-t_1)} \leq \|x_1-x_2\|e^{b[2](t-t_1)+b[1](t_1-t_0)}$.

The procedure above can be performed iteratively as follows. For any time $t \in [t_{i-1},t_i]$, by Lemma 4.8, we know at time $t_{i-1}$, $\xi(x_1,t_{i-1})$ and $\xi(x_2,t_{i-1})$ are contained in $B_{\Delta_{i-1}}(R_{i-1})$. By Lemma 4.7 it follows that $$\|\xi(x_1,t)-\xi(x_2,t)\| \leq \|\xi(x_1,t_{i-1})-\xi(x_2,t_{i-1})\|e^{b[i](t-t_{i-1})} \leq$$

$$\|x_1-x_2\|e^{b[i](t-t_{i-1})+\sum_{j=1}^{i-1} b[j](t_j-t_{j-1})}.$$

Next we will prove that $$\beta(x_1,x_2,t) \equiv \|x_1-x_2\|e^{b[i](t-t_{i-1})+\sum_{j=1}^{i-1} b[j](t_j-t_{j-1})}$$

is a valid LDF.

In Lines 7-10, because J is a real matrix, the maximum eigenvalue $\lambda$ of $(J^T+J)/2$ is bounded. Assume that each component of $E(x)=J_f^T(x)+J_f(x)-J^T-J$ is continuous over the closed set S, then we can find the upper bound of $\|E(x)\|$, so the "error" term is also bounded. Therefore, each b[i] is bounded. So $\forall t \in [t_{i-1},t_i]$, $i=1, \ldots, k$, $\exists N < \infty$, such that $$e^{b[i](t-t_{i-1})+\sum_{j=1}^{i-1} b[j](t_j-t_{j-1})}$$

is bounded by N from the above.

As $x_1 \to x_2$, then $$\|x_1-x_2\|e^{b[i](t-t_{i-1})+\sum_{j=1}^{i-1} b[j](t_j-t_{j-1})} \to 0.$$

And for any $\varepsilon > 0$, $\exists \delta = \varepsilon/N > 0$, such that $\forall x_1, x_2 \in B_\delta(R_0)$ and $\|x_1-x_2\| < \delta$, it follows $$\|x_1-x_2\|e^{b[i](t-t_{i-1})+\sum_{j=1}^{i-1} b[j](t_j-t_{j-1})} < \varepsilon/N \cdot N = \varepsilon.$$

So $$\beta(x_1, x_2, t) = \|x_1 - x_2\| e^{b[i](t-t_{i-1}) + \sum_{j=1}^{i-1} b[j](t_j - t_{j-1})}$$

is a $B_\delta(R_0)$-local piecewise discrepancy function and the array b contains the corresponding coefficients.

Coordinate Transformation

In this section, we will discuss the issue that the upper bound of the symmetric part of the Jacobian computed in Lines 7-10 may introduce loss in precision. We propose a strategy to reduce this loss by first performing a coordinate transformation. Consider a simple linear system:

$$\dot{x} = [0 \ 3; -1 \ 0]x, \quad (4)$$

which has eigenvalues $\pm\sqrt{3}i$ and thus its trajectories oscillate. The symmetric part of the Jacobian is [0 1;1 0] with eigenvalues ±1, which gives the exponentially growing discrepancy with b=1. In what follows, we will see that a tighter bound can be obtained by first taking a linear transformation of x. The following is a coordinate transformed version of Lemma 4.7. The coordinate transformation matrix P can be any n×n real invertible matrix, and the condition number of P is $\|P\|\|P^{-1}\|$.

Lemma 4.10.

In $i^{th}$ iteration of the loop, for any $x_1, x_2 \in B_\Delta(R_{i-1})$, and any $t \in [t_{i-1}, t_i]$.

$$\|\xi(x_1,t) - \xi(x_2,t)\| \le K\|x_1 - x_2\| e^{\tilde{\lambda}_{max}(S)(t-t)_{i-1}},$$

where $\tilde{\lambda}_{max}(S)$ is the upper bound of $\frac{1}{2}(\tilde{J}_f^T(x) + \tilde{J}_f(x))$ over the set S, $\tilde{J}_f(x) = PJ_f(x)P^{-1}$ and K is the condition number of P.

The proof of Lemma 4.10 is similar to the proof of Lemma 4.7 considering the coordinate transformation. This shows that the distance can be bounded in the same way for the transformed system with a (possibly much smaller) $\tilde{\lambda}_{max}(S)$ but with an additional multiplicative cost of cond (P).

To choose the coordinate transformation matrix, one approach that produces good empirical results is making the Jacobian matrix at the center point a real Jordan form. Let S be the set computed in Line 6 and J is the Jacobian evaluated at the center $s_0$ S. Let $\tilde{J} = PJP^{-1}$ be the real Jordan form and use the matrix P as the coordinate transformation matrix for $J_f(x)$.

Contraction matrix introduces more general coordinate transformation. However, there are no general methods to compute it for nonlinear systems. Choosing a constant matrix as transformation is an implementable approach, and Lemma 4.10 applies to any invertible matrix. In the previous example (4), the Jacobian matrix is constant, and the discrepancy function without coordinate transformation is:

$$\|\xi(x_1,t) - \xi(x_2,t)\| \le \|x_1 - x_2\| e^{t-t_1}.$$

If we use $P = [1 \ 3; -\sqrt{3} \ \sqrt{3}]$ as the coordinate transformation matrix, $\tilde{J} = PJP^{-1} = [0 \ \sqrt{3}; -\sqrt{3} \ 0]$, and the discrepancy function with coordinate transformation is $$\|\xi(x_1,t) - \xi(x_2,t)\| \le \sqrt{3}\|x_1 - x_2\|.$$

In practice, the coordinate transformation can be made for longer time interval $[t_{i-k}, t_i]$ where k>2, to reduce the multiplicative error term $\Pi cond(P[i])$.

Local Input-State Discrepancy

Large and complex models of dynamical system are created by composing smaller modules or subsystems. Consider a dynamical system A consisting of several interacting subsystems $A_1, \ldots, A_N$, that is, the input signals of a subsystem $A_i$ are driven by the outputs (or states) of some another component $A_j$. Let's say that each $A_i$ is n-dimensional, which makes A an nN-dimensional system. One way of achieving scalable verification of A is to exploit this compositional structure and somehow analyze the component $A_i$'s to infer properties of A.

Input-to-state (IS) discrepancy can address the problem of finding annotations for large models. It is shown that if we can find IS discrepancy functions for the individual component $A_i$, then we can construct a reduced N-dimensional model M such that the executions of M serve as the discrepancy of the overall system. Thus, from IS-discrepancy for the smaller $A_i$ models and simulations of the N-dimensional system M, we are able to verify A. This has the beneficial side-effect that when the $A_i$'s are rewired in a new topology, then only the reduced model changes. However, another approach still assumes that the user provides the IS-discrepancy for the smaller modules. In this section, we will show the approach used in the previous section can be used to get IS discrepancy function for Lipschitz continuous nonlinear subsystems $A_i$. Furthermore, it gives an over-approximation of the reachsets with nondeterministic bounded inputs.

Defining Local IS Discrepancy

Consider a dynamical system with inputs:

$$\dot{x} = f(x,u) \quad (5)$$

where $f: R^n \times R^p \to R^n$ is Lipschitz continuous. For a given input signal that is a integrable function $\upsilon: [0, \infty) \to R^p$, and an initial state $x_0 \in R^n$, a solution (or trajectory) of the system is a function $\xi: R^n \times R_{\ge 0} \to R^n$ such that $\xi(x_0,0) = x_0$ and for any time $t \ge 0$, $\dot{\xi}(x,t) = f(\xi(x,t), \upsilon(t))$.

First, we give the original definition of IS discrepancy function for the system in dynamical system (5). Here, U is the set $\{u | u: [0, \infty) \to R^p\}$ of all input signals.

Definition 5.1.

A pair of uniformly continuous functions $\beta: R_{\ge 0} \times R_{\ge 0} \to R_{\ge 0}$ and $\gamma: R^{\ge 0} \to R^{\ge 0}$ is called C-local input-to-state discrepancy if (1) $\beta$ is of class K with respect to its first argument and $\gamma$ is also of class K, and (2) for any pair of initial states x, x'∈C, any pair of input signals u, u'∈U, and $t \in R_{\ge 0}$:

$$\|\xi(x,t) - \xi(x',t)\| \le \beta(\|x-x'\|,t) + \int_0^t \gamma(\|u(s) - u'(s)\|) ds.$$

For a bounded, compact set $I \subseteq R^p$. A family of bounded time input signals over I is the set $U(I) = \{u | u: [0,T) \to I\}$ of integrable functions. We denote Reach $(K, U(I), [t_1, t_2])$ as the reachable states of the system from compact set K with input set U(I) over $[t_1, t_2]$. Next, we introduce an inductive definition of IS discrepancy for inputs over compact neighborhoods. For example, an inductive definition of an object B parameterized by some number, n, is of the form B(0)=constant and B(n)=f(B(b-)), where f is some ordinary function. Example:

a. Factorial(n) is usually defined as Factorial(0)=1.

b. Factorial(n)=Factorial(n-1)×n.

Definition 5.2.

Consider compact sets $K \in R^n$, $I \in R^p$ and a sequence of time points $0 = t_0 < t_1 < t_2 < \ldots < t_k = T$. For any pair of initial states $x_1, x_2 \in K$, any pair of input signals $u_1, u_2 \in U(I)$, the (K,U(I))-local IS discrepancy function $\alpha: K^2 \times U(I)^2 \times R^{\ge 0} \to R^{\ge 0}$ is defined as:

$\alpha(x_1, x_2, u_1, u_2, t) =$ $$\begin{cases} \|x_1 - x_2\|, & \text{if } t = t_0, \\ \alpha(x_1, x_2, u_1, u_2, t_{i-1})e^{a[i](t-t_{i-1})} + \\ M[i]e^{a[i](t-t_{i-1})} \int_{t_{i-1}}^{t} \|u_1(\tau) - u_2(\tau)\| d\tau & \text{if } t \in (t_{i-1}, t_i] \end{cases}$$

where a[1], . . . , a[k],M[1], . . . , M[k] are real constants.

Algorithm for Local IS Discrepancy

The approach to find (K,U(I))-local IS discrepancy function is similar to the ComputeLDF algorithm 300 (FIG. 3), which also uses a for-loop to compute the coefficients a[i] and M[i]. The changes are 1) in Line 6, in which S should be computed as in Lemma 5.3, 2) in Line 11, in which Δ should be updated as in Lemma 5.5. Next, we illustrate this process in more detail. First, we use Lipschitz constant to get a coarse over-approximation of Reach $(K,U(I),[t_{i-1},t_i])$ parallel to Lemma 4.2. Let l=dia(I).

Lemma 5.3.

In the $i^{th}$ iteration of the for-loop, Reach $(B_\Delta(R_{i-1}), U(I),[t_{i-1},t_i]) \subseteq S$, where S=hull$(R_{i-1}, R_i) \oplus B_{\Delta'}(R_i)$ and $\Delta' = (\Delta + \varepsilon)(e^{L_f \tau_i}) + l L_{f_e} e^{L_f \tau_i} \tau_i$, $\tau_i = t_i t_{i-1}$.

Two trajectories starting from $x_1, x_2 \in \mathbb{R}^n$ at $t_{i-1}$, with $u_1, u_2 \in U(I)$ as inputs respectively, their distance at time t, $\|\xi(x_1,t) - \xi(x_2,t)\| \leq \|x_1 - x_2\|(e^{L_f(t-t_{i-1})}) + L_f e^{L_f(t-t_{i-1})} \cdot \int_{t_{i-1}}^{t} \|u_1(\tau) - u_2(\tau)\| d\tau$. The lemma directly follows this inequality.

Next we give a one-step IS discrepancy function in Lemma 5.5. Before proving it, we need another generalized form of mean value theorem: Lemma 5.4. For any continuous and differentiable function $f: \mathbb{R}^n \times \mathbb{R}^p \to \mathbb{R}^n$, $f(x+r,u+w) - f(x,u) = (\int_0^1 J_x(x+sr,u+w)ds)r + (\int_0^1 J_u(x,u+\tau w)d\tau)w$, where $$J_x = \frac{\partial f(x,u)}{\partial x} \text{ and } J_u = \frac{\partial f(x,u)}{\partial u}$$

are the Jacobian matrices of $f$ with respect to x and u.

Proof.

The lemma follows by writing $$f(x+r,u+w) - f(x,u) = f(x+r,u+w) - f(x,u+w) + f(x,u+w) - f(x,u)$$

and then invoking Lemma 4.3.

Lemma 5.5

Consider the $i^{th}$ iteration of the loop for a dynamic system (5). Let $x,x' \in B_\Delta(R_{i-})$, and $\xi(x,t)$, $\xi(x',t)$ be the trajectories starting from x and x' with input $u_1(t), u_2(t) \in U(I)$ respectively, where $t \in [t_{i-1}, t_i]$. Then, $$\|\xi(x,t) - \xi(x',t)\| \leq \|x - x'\| e^{a(t-t_{i-1})} + M e^{a(t-t_{i-1})} \int_{t_{i-1}}^{t} \|u_1(\tau) - u_2(\tau)\| d\tau, \quad (6)$$

where $a = \lambda_{max}(S) + \frac{1}{2}$, $\lambda_{max}(S)$ is the upperbound of the eigenvalues of the symmetric part of $J_x$ over S, and $$M = \max_{u \in U(I)} (\|J_u(\xi(x,t),u)\|).$$

To prove Lemma 5.5, we will use Lemma 5.4. Using Lemma 5.5 to get the coefficients a[i] and M[i] in each time interval $[t_{i-1},t_i], i=1 \ldots, k$, we will have Theorem 5.6.

Theorem 5.6

The items in array a and M are a coefficients of the (K,U(I))-local IS discrepancy function for the dynamical system (5). This theorem enables us to compute the (K,U (I))-local IS discrepancy function for each subsystem, $A_i$. Although in the original definition we assume the IS discrepancy function is valid for any input signals $u_1, u_2 \in U$, in practice $A_i$ can only take $A_j$'s outputs or states as inputs, which is bounded. Accordingly, the (K,U(I))-local IS discrepancy function here can over-approximate the reachset of the systems in dynamical system (5) with the input u being chosen nondeterministically in some compact set.

Experimental Evaluation

We have implemented the verification algorithm 200 (FIG. 2) and the ComputeLDF subroutine 300 (FIG. 3) with coordinate transformations in Matlab®. The implementation and the examples are available from C. Fan and S. Mitra, "Bounded Verification with On-the-Fly Discrepancy Computation," full version (2015).

For simulation we use Matlab's built-in ordinary differential equation (ODE) solver. The Jacobian matrix and an upper bound of the Lipschitz constant are given as inputs. In addition, the user has to provide a function that term-wise maximizes the error matrix. We use the absolute error for ODE solver as the error bounds for simulation. The results presented here are based on experiments performed on an Intel Xeon V2 desktop computer.

Comparison with Other Tools.

We compare the performance of our algorithm with two other tools, namely, Flow* and HyCreate, for safety verification problem of nonlinear dynamical systems. We use seven benchmarks that are shown in the table of FIG. 4 with time bound T=10 s. FIG. 4 includes safety verification for benchmark examples where dim=dimension of the model; δ=diameter of the initial set; U=unsafe set; #Sim=number of simulations with coordinate transformation; LDF=runtime of the present ComputeLDF implementation (with coordinate transformation) in secs.

Flow* uses Taylor models for approximating reachtubes from a set of initial states. Currently, it returns "Safe" or "Unknown," but not "Unsafe." HyCreate uses a face-lifting approach and provides an intuitive interface for creating models.

Vanderpol, CoupledVanderpol, JetEngine, and Brusselator are commonly used, low-dimensional, nonlinear benchmarks. Sinusoidal tracking is a 6-dimensional nonlinear analyzer designed as a frequency estimator. The Lorenz Attractor (row 7) is a well known chaotic dynamical system. Robot arm is a 4-dimensional nonlinear system described in D. Angeli, E. D. Sontag, and Y. Wang, "A Characterization of Integral Input-to-State Stability, *IEEE Trans. Autom. Control*, 45(6):1082-1097 (2000). The Helicopter is a high dimension linear model of a helicopter system from G. Frehse, C. Le Guernic, A. Donzé, S. Cotton, R. Ray, O. Lebeltel, R. Ripado, A. Girard, T. Dang, and O. Maler, "Spaceex: Scalable Verification of Hybrid Systems, in *CAV*, pp. 379-395 (2011). In row 10 and row 11, we increase the time bound of the fixed-wing model to T=50 and T=100, respectively, and the results show that the algorithm scales reasonably for longer time horizons. Columns (#Sim) and (LDF) are the results of the ComputeLDF algorithm 300 (FIG. 3) with coordinate transformation.

Flow* and HyCreate generate a single over-approximation of the reachtube from the initial set independent of the safety property, although the verification algorithm 200 (FIG. 2) can refine the initial sets when the reachtube intersects with the unsafe set. In these benchmarks, we make the unsafe set close to the reachtubes, to make the models safe yet several refinements can be employed to arrive at that conclusion. Overall, the proposed approach with coordinate transformation outperformed others in terms of the running time, especially in high dimensional benchmarks. The "TO" in the table means the algorithm timed out at 30 minutes. Of course, our implementation requires the users to give the symbolic expression of the Jacobian matrix and term-wise maximization functions, while Flow* and HyCreate just needs the differential equations. Moreover, our implementation currently handles nonlinear dynamical systems, and both Flow* and HyCreate can handle hybrid systems.

Properties of LDF.

We explore the behavior of the verification algorithm with respect to changes in the relative positions of the initial set and the unsafe set. We use the nonlinear model of the Robot arm system. We fix the point [1.5,1.5,0,0] as the center of the initial set and T=10 seconds as the time bound, and vary the diameter of the initial set ($\delta$) and the unsafe set (∪: $\theta$>c), where $\theta$ is the angle of the arm. The number of simulations used by the algorithm with coordinate transformation (#Sim), the diameter of the reach tube at the final time T (dia), and the total running time (RT) are shown in the table of FIG. 5.

From the first 4 rows in the table of FIG. 5, we see the expected behavior that for a fixed unsafe set, the diameter of the Reachtube decreases with decreasing $\delta$. This corresponds to the property that the discrepancy function $\beta(x,x',t)$ goes to zero ("0") as the initial points x→x', and therefore the error in the reachability computation decreases monotonically with the diameter of the initial set. Rows 3 and 5-6 show that, if we fix the size of the initial set, then as the unsafe set comes closer to the actual reachtube, the number of simulations increases and therefore the running time increases until the system becomes unsafe. As more refinements are made by the algorithm, the accuracy (measured by the diameter of the reachtube) improves. Similar trend is seen in rows 7-8, where the algorithm will need more refinements to find a counter example that shows unsafe behavior, if the unsafe set is close to the boundary of the reachtube.

Next, we explore the behavior of the algorithm (with coordinate transformation) with large initial sets. We use the 7-dimensional model of a fixed-wing unmaned aerial vehicle (UAV). The initial sets are defined as balls with different radii around a center point [30,980,0,125,0,0,30.4] and $\delta$ in the first column is the diameter of the initial sets. The unsafe set is defined as H>c, where H is the thrust of the UAV. The time horizon is fixed at T=10 seconds. As shown the table of FIG. 6, the disclosed verification algorithm can handle large initial set and high dimension systems. Although the verification algorithm may need many simulations (24001 covers), the algorithm terminates in 30 mins. All the results of the table in FIG. 6 are safe.

Figure 7:
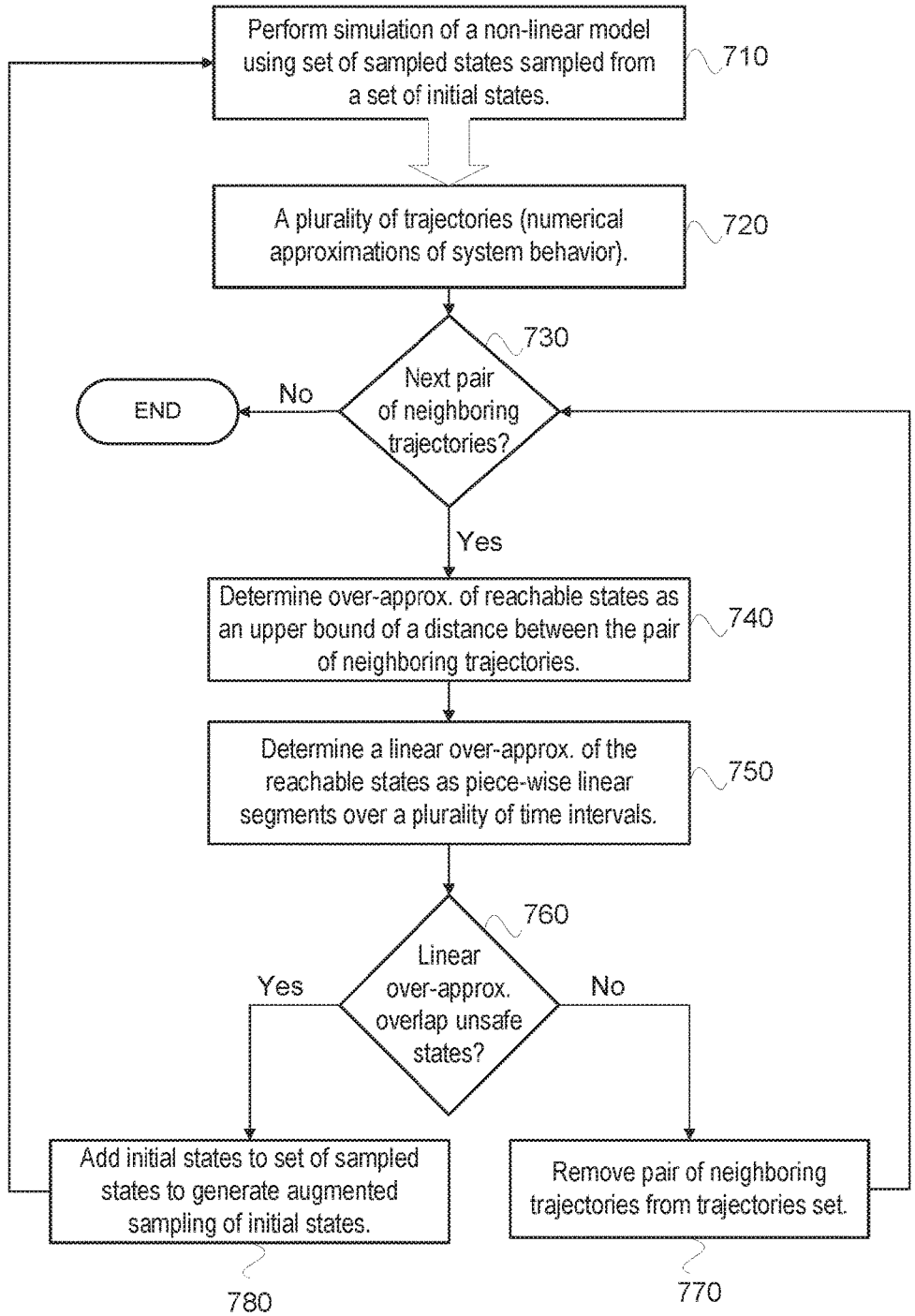
FIG. 7 is a flow chart of a method for safety verification of a non-linear model of a control system that is to interact with a physical system through local discrepancy computations, according to an embodiment of the present disclosure.

FIG. 7 is a flow chart of a method safety verification of a non-linear model of a control system that is to interact with a physical system through local discrepancy computations, according to an embodiment of the present disclosure. The method may be executed by the computing system 100 of FIG. 1 or the computing system of FIG. 12, or a combination thereof, and with respect to a set of unsafe states, which can embody or define a number of safety requirements for the physical system.

The method can begin by performing a simulation of the non-linear model using a set of sampled states from a plurality of initial states (710), to generate a plurality of trajectories over bounded time (720), wherein a trajectory is a set of numerical approximations of behavior of the physical system. This plurality of trajectories can make up a set of trajectories to test for safety. The method can continue by determining whether a pair of neighboring trajectories has not been analyzed (730). If yes, the method can determine, for the neighboring pair of trajectories, an over-approximation of reachable states of the physical system as an upper bound of a distance between a pair of neighboring trajectories (740), wherein the distance approaches zero ("0") as initial states of the pair of neighboring trajectories approach each other. The method can also determine, for the neighboring pair of trajectories, a linear over-approximation of the reachable states as piece-wise linear segments over a plurality of time intervals (750).

The method can further determine whether the linear over-approximation overlaps in any of the piece-wise linear segments with the unsafe states (760), to verify the non-linear model of the control system is safe. If the answer is no, then the pair of neighboring trajectories is removed from the set of trajectories being analyzed for safety (770). If the answer is yes, then the method can add additional initial states to the set of sampled states to generate an augmented sampling of initial states (780), and begin the method over again from block 710 using the augmented sampling of the initial states. The method of FIG. 7 may include additional or different steps, and the steps may be executed in a different order unless described to include a specific order.

Modular Annotations

We present a modular technique for simulation-based bounded verification for nonlinear dynamical systems. We introduce the notion of input-to-state (IS) discrepancy of each subsystem $A_i$ in a larger nonlinear dynamical system A that bounds the distance between two (possibly diverging) trajectories of $A_i$ in terms of their initial states and inputs. Using the IS discrepancy functions, the computing system 100 can construct a low dimensional deterministic dynamical system M($\delta$). For any two trajectories of A starting $\delta$ distance apart, we show that one of them bloated by a factor determined by the trajectory of M contains the other. Further, by choosing appropriately small $\delta$'s, the overapproximations computed by the above method can be made arbitrarily precise. Using the above results, we develop a sound and relatively complete algorithm for bounded safety verification of nonlinear ODEs. Our preliminary experiments with a prototype implementation of the algorithm show that the approach can be effective for verification of nonlinear models.

For nonlinear dynamical systems that do not admit analytic solutions, one has to exclusively rely on numerical simulations. Though simulations give sufficient confidence for design, testing, and performance analysis in many application scenarios, for mathematical guarantees or verification, they are of limited use. Particularly resistant to simulation-based verification are nonlinear models with large sets of initial conditions, inputs, and unknown parameters.

A strategy of one approach relies on the following simulate-and-bloat step: For a particular initial state x and a time bound T, compute a (possibly inaccurate) simulation of the system $\xi_x$ starting from x up to time T. Then, the simulated trajectory $\xi_x$ is bloated by some factor, to get a reachtube B($\xi_x$) that contains the trajectories starting from a neighborhood B(x) of initial states around x up to T. The simulate-and-bloat step is repeated for finitely many initial states and their union is guaranteed to over-approximate the reach set of the system from the initial states up to time T. The technique works as well for dynamical systems with a bounded number of unknown parameters, by encoding the nondeterministic choices in the initial state and it is quite parallel as the each simulate-and-bloat can be computed independently.

The bloating factor dictates performance of verification with the above strategy. From basic continuity of the trajectories, we know that neighboring initial states have trajectories that remain close over time. With more information about the sensitivity of the trajectories to the initial state we can obtain bounds on the distance between neighboring trajectories. For example, Lipschitz continuity of the dynamic function gives a bound on the distance between the neighboring trajectories that grows exponentially with time. Stronger notions like sensitivity, incremental Lyapunov functions, and contraction metrics for dynamical system are used in a previous inventor work to obtain more practically useful bounds.

Discrepancy functions can generalize several of these properties and bounds according to the bloating factor as a function of the size of the initial neighborhoods. The inventors used these discrepancy functions for bounded time verification of nonlinear and switched models. But there are no general techniques for computing discrepancy functions (or for that matter sensitivity, contraction metrics and incremental Lyapunov functions) from the syntactic description of a dynamical system. One typically assumes a template polynomial for the candidate function and then solves an optimization problem to find the coefficients or assumes that this information is provided by the system designer as an annotation to the model. Obviously, the problem of finding these annotations becomes harder for larger models in which many components interact. In other works, stability and safety of a composed system can be checked by solving a subsystem-level optimization problems. However, this approach does not guarantee completeness.

In the present disclosure, we present a new technique for simulation and approximation-based verification for large dynamical systems which only uses input-to-state discrepancy for the smaller constituent subsystems. Consider a large dynamical system A consisting of several interacting subsystems $A_1, \ldots, A_N$, that is, the input signals of a subsystem $A_i$ are driven by the outputs (or states) of some other components $A_j$. Lets say that each $A_i$ is n-dimensional which makes A an nN-dimensional system. We employ a new type of input-to-state discrepancy function (IS discrepancy) for each subsystem $A_i$ to construct a (small) N+1-dimensional dynamical system M that bounds the needed bloating factor for A. An IS discrepancy for $A_i$ gives a bound on the distance between two trajectories as a function of (a) their initial states; and (b) the inputs they experience.

Input-to-state stability (ISS), its variants and their characterization in terms of necessary and sufficient conditions have been one of the major advances of nonlinear control theory in the last two decades. Incremental ISS has been used to construct discrete symbolic models that approximately bisimulate continuous systems. Under additional assumptions about the stability of the overall system, it has been shown that a large system can be reduced to a smaller system with similar behaviors. Our work is the first to connect these ideas to simulation-based safety verification of composed systems. Moreover, our technique does not rely on any stability assumptions of the composed system. Our results explain how larger compositions of such subsystems can be automatically verified with a reduced number of the subsystems that make up the larger composition.

We introduce a method for constructing an approximation of a composed dynamical system using the IS discrepancy functions of the components. Specifically, we use the collection of IS discrepancy functions for the subsystems to define a family of dynamical systems M(δ), where the parameter δ defines the initial state of M.

We show that M(δ) has a unique trajectory µ, and that any trajectory $\xi_x$ of A point-wise bloated by the value of µ(t) contains the reach set of all the trajectories of A starting from a δ-ball around x. Thus, by simulating A and (the smaller) M we can compute bounded-time reach set overapproximations of A. We also show that by choosing appropriately small δ's, the overapproximations computed by the above method can be made arbitrarily precise; modulo the precision of the numerical simulations.

Using the above results, we develop an algorithm 1000 for bounded safety verification of nonlinear dynamical systems that iteratively refines initial set partitions (FIG. 10). We show that the algorithm is sound and is guaranteed to terminate whenever the model is robustly safe or unsafe with respect to a given unsafe set. Our preliminary experimental results with a prototype implementation of the algorithm validates the approach and underscore its promise.

We will use the notations from the hybrid I/O automaton (HIOA) framework for modeling compositions of dynamical systems. For a natural number n∈N, [n] is the set $\{1, 2, \ldots, n\}$. For a sequence A of objects of any type with n elements, we refer to the $i^{th}$ element, i≤n by $A_i$. Let V be a finite set of real-valued variables. Variables are names for state and input components. A valuation v for V is a function mapping each variable name to its value in R. The set of valuations for V is denoted by Val(V).

For any function, $f: A \mapsto B$ and a set $S \subseteq A$, $f\lceil S$ is the restriction of $f$ to S. That is, $(f\lceil S)(s) = f(s)$ for each s∈S. So, for a variable v∈V and a valuation v∈Val(V), v⌈v is the function mapping {v} to the value v(v).

Trajectories model the continuous evolution of variable valuations over time. A trajectory for V is a differentiable function $\tau: R_{\geq 0} \mapsto Val(V)$. The set of all possible trajectories for V is denoted by Traj(V). For any function, $f: C \mapsto [A \mapsto B]$ and a set $S \subseteq A$, $f \downarrow S$ is the restriction of $f(c)$ to S. That is, $(f \downarrow S)(c) = f(c) \lceil S$ for each c∈C. In particular, for a variable v∈V and a trajectory τ∈Traj(V), τ↓v is the trajectory of v defined by τ.

Valuations can be viewed as vectors in $R^{|V|}$ dimensional space by fixing some arbitrary ordering on variables. For a valuation v, |v| is $l^2$-norm of the vector of variable values. $B_\delta(v) \subseteq Val(V)$ is the closed ball of valuations with radius δ centered at v. The notions of continuity, differentiability, and integration are lifted to functions defined over sets of valuations in the usual way.

A function $f: A \mapsto R$ is Lipschitz if there exists a constant L≥0—called the Lipschitz constant—such that for all $a_1, a_2 \in A |f(a_1) - f(a_2)| \leq L|a_1 - a_2|$. A continuous function α: $R_{\geq 0} \mapsto R_{\geq 0}$ is in the class of K functions if α(0)=0 and it is strictly increasing. Class K functions are closed under composition and inversion. A class K function α is a class $K_\infty$ function when α(x)→∞ as x→∞. A continuous function β: $R^{\geq 0} \times R^{\geq 0} \mapsto R^{\geq 0}$ is called a class KL function if for any t, β(x,t) is a class K function in x and for any x, β(x,t)→0 as t→∞.

Dynamical System Modules

A dynamical system is specified by a collection of ordinary differential equations (ODEs), possibly with inputs, and a set of initial states. For reducing notational complexity, we identify output variables with state variables in this paper but our results can be extended to systems where outputs are distinct in a straightforward manner. The following definition introduces this class of dynamical systems.

Definition 6.

A dynamical system A is a tuple <X,U,Θ,f> where:

1. X is a set of variables called the state variables; valuations of X are called state;

2. U is a set of variables called the input variables that are distinct from the state variables;

3. $\Theta \subseteq \text{Val}(X)$ is a compact set of initial states;

4. $f: \text{Val}(X) \times \text{Val}(U) \mapsto \text{Val}(X)$ is called the dynamic mapping. In addition, $f$ is Lipschitz continuous with respect to both arguments.

An input signal of A is a trajectory of input variables $\eta \in \text{Traj}(U)$. For a given input signal $\eta \in \text{Traj}(U)$ and an initial state $x \in \Theta$, the solution (or trajectory) of A is a state trajectory $\xi \in \text{Traj}(X)$ satisfying: (a) $\xi(0)=x$, for any $t \in R_{\geq 0}$, the time derivative of $\xi$ at t satisfies the differential equation:

$$\dot{\xi}(t)=f(\xi(t),\eta(t)). \qquad (7)$$

Under the Lipschitz assumption of the dynamic mapping and the differentiability of $\eta$, the differential equation (7) admits a unique solution. This solution $\eta$ is uniquely defined by the initial state $x \in \text{Val}(X)$ and the input signal $\eta \in \text{Traj}(U)$. A dynamical system without inputs ($U=\emptyset$) is said to be closed; otherwise, the dynamical system is open. For a closed system, for any $x \in \text{Val}(X)$, $\text{Traj}(A,x)$ is a singleton.

The set of all trajectories of A with respect to a set of initial states $\Theta' \subseteq \text{Val}(X)$ and a set of input signals $H \subseteq \text{Traj}(U)$ is denoted by $\text{Traj}(A,\Theta',H)$. We will drop the argument H for closed dynamical systems. The components of dynamical system A and $A_i$ are denoted by $X_A, U_A, \Theta_A, f_A$ and $X_i, U_i, \Theta_i, f_i$, respectively. We will drop the subscripts when they are clear from context.

Next, for a closed dynamical system A, we define reachable states and safety. A state $x \in \text{Val}(X)$ is T-reachable when there exists a trajectory $\xi \in \text{Traj}(A,\Theta,\emptyset)$ and a time $t \geq T$ such that the trajectory $\xi(t)=x$. The set of T-reachable states is denoted by $\text{Reach}_A(\Theta,T)$ and the set of all reachable states is denoted by $\text{Reach}_A(\Theta)$.

Definition 7.

For $\varepsilon \geq 0$ and time $T \geq 0$, and an open unsafe set $U \subseteq \text{Val}(X)$, A is $\varepsilon$-robustly safe up to T with respect to U when $B_\varepsilon(\text{Reach}_A(\Theta,T)) \cap U = \emptyset$. If there exists some $\varepsilon > 0$ for which this condition holds, then A is robustly safe up to T with respect to U.

In the present disclosure, we present an approach uses modular annotations for dynamic analysis in order to compute reachable sets.

Large and complex dynamical system models are created by composing smaller modules or subsystems. Formally, the composition operation takes a pair of compatible subsystems and defines a new dynamical system by plugging in or identifying the input variables of one subsystem with state variables of another. Several subsystems can be composed inductively. The resulting system may still have input variables that are not identified with any of the state variables. A pair of dynamical subsystems $A_1$ and $A_2$ are compatible if they do not share any of the state variables, e.g., $X_1 \cap X_2 = \emptyset$.

Definition 8.

For a pair of compatible dynamical systems $A_1 = \langle X_1, U_1, \Theta_1, f_1 \rangle$ and $A_2 = \langle X_2, U_2, \Theta_2, f_2 \rangle$, their composition $A = A_1 \| A_2$ is the tuple $(X,U,\Theta,f)$, where:

1. $X = X_1 \cup X_2$,
2. $U = U_1 \cup U_2 \setminus (X_1 \cup X_2)$,
3. $\Theta = \{x \in \text{Val}(X) | (x \lceil X_i) \in \Theta_i, i \in \{1,2\}\}$, and
4. $f: \text{Val}(X) \times \text{Val}(U) \rightarrow \text{Val}(X)$ is defined as: For each $x \in \text{Val}(X)$, $u \in \text{Val}(U)$, $i \in \{1,2\}$, $f(x,u) \lceil X_i = f_i(x \lceil X_i, w)$, where for each $u \in U_i$:

$$w(u) = \begin{cases} x(u) & \text{if } u \in X \setminus X_i, \\ u(u) & \text{otherwise.} \end{cases}$$

The definition of w creates a valuation for $U_1$ by combining valuations of $X_2$ and U, (creates a valuation for $U_2$ by combining valuations of $X_1$ and U). The definition for $f$ ensures that the inputs to $A_1$ that come from $A_2$ are mapped correctly and those that are left unmapped remain as inputs variables in A. It can be checked that $f$ is Lipschitz since $f_1$ and $f_2$ are Lipschitz. Therefore, A is indeed a dynamical system and has well-defined trajectories for differentiable input signals.

Example 1

Figure 8:
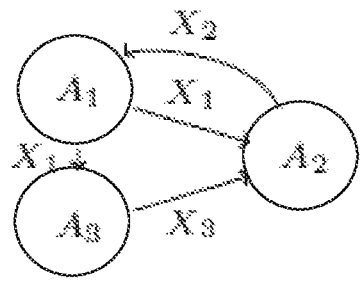
FIG. 8 is a flow diagram and matrix depicting dynamical synchronization where multiple subsystems start from different initial states and communicate to agree on a trajectory, according to an embodiment of the present disclosure.

Consider a dynamical synchronization problem where multiple subsystems start from different initial states and communicate to agree on a trajectory. The interaction is shown by the graph in FIG. 8. Each $A_i$, $i \in \{1,2,3\}$, is a dynamical system with the following components: (i) $X_i = \{x_{i1}, x_{i2}, x_{i3}, x_{i4}\}$, (ii) $\eta_i$ is a compact subset of $\text{Val}(X_i)$, (iii) $U_1 = X_2, U_2 = X_1 \cup X_3$ and $U_3 = X_1$, and (iv) for all $x_1 \in \text{Val}(X_1)$, $u_1 \in \text{Val}(U_1)$, and $f_1(x_1,u_1) = Dx_1 + u_1$. Similarly, $f_2(x_2, u_2) = Dx_2 + \frac{1}{2}[I,I]u_2$ and $f_3(x_3,u_3) = Dx_3 + u_3$, where D is a 4×4 matrix and I is the identity matrix.

According to Definition 8, the overall system $A = A_1 \| A_2 \| A_3$ with (i) $U_A = \emptyset$, and (ii) for any $x \in \text{Val}(X_A)$, $$f_A(x) = \begin{bmatrix} D & I & 0 \\ 0.5I & D & 0.5I \\ I & 0 & D \end{bmatrix} x.$$

For a closed composed system $A = A_1 \| \ldots \| A_N$, a subsystem $A_i$'s input variables are in the set of state variables of A: $U_i \subseteq X_A$. For any state x of A, let $\xi = \text{Traj}(A,x)$ be the trajectory of A. It can be shown that for any subsystem $A_i$, the restriction of $\xi$ onto $A_i$'s state variables is a trajectory of $A_i$ under the input signal $f_i$, where $\eta_i$ is defined as $\xi$ restricted to $A_i$'s input variables. That is $\xi \downarrow X_i = \text{Traj}(A_i, x(X_i), \xi \downarrow U_i)$.

Input-To-State Annotations

For bounded time safety verification of complex dynamical systems, we propose to use annotations for the individual modules. We rely on designers to provide these annotations, perhaps based on their insights about module's designed behavior or through additional computations performed explicitly for finding annotations. We relate these annotations to several existing concepts that are used in the control theory literature for stability analysis.

IS Discrepancy

The annotation of a module A can bound the distance between two trajectories of A with different initial states and inputs. We call such an annotation an input-to-state (IS) discrepancy function or simply an IS discrepancy function.

Definition 9.

For a dynamical system A, a continuous functions V: $\text{Val}(X)^2 \mapsto R_{\geq 0}$ is an input-to-state discrepancy function when:

$\exists \beta: R^{\geq 0} \times R^{\geq 0} \mapsto R^{\geq 0}$ of class-K in the first argument and $\gamma \in K$ such that for any $\theta, \theta' \in \Theta$, input trajectories $\eta, \eta' \in \text{Traj}(U) \text{Traj}(U)$, and $t \in R^{\geq 0}$, $$V(\xi(t), \xi'(t)) \leq \beta(|\theta - \theta'|, t) + \int_0^t \gamma(|\eta(s) - \eta'(s)|) ds, \qquad (8)$$

where $\xi = \text{Traj}(A,\theta,\eta)$ and $\xi' = \text{Traj}(A,\theta',\eta')$.

The discrepancy function pair $\beta, \gamma$ bounds the maximum distance between two trajectories in terms of the $l^2$ distance between their input signals and their initial states. In the rest of the paper, we further assume that $\underline{\alpha}^{-1}$ and $\gamma$ are Lipschitz, and $\beta(\cdot, \cdot)$ has a Lipschitz continuous derivative in the second argument. In general the IS discrepancy annotations have to be provided with the system model. For some classes of models, however, annotations may be computed automatically or obtained from other certificates used for stability proofs. See, for example, Lemma 5.3 and Theorem 5.6, which give methods for computing IS-discrepancy.

Finding IS Discrepancy

We note three different ways of obtaining IS discrepancy functions, including (i) Lipschitz Dynamics, (ii) Stable Linear Systems, and (iii) Incremental Integral (ISS).

Lipschitz Dynamics

If the dynamic mapping $f$ of system A is Lipschitz, then for any bounded time $T>0$, we can find an IS discrepancy function of A that holds for all $t \in [0,T]$. This version of IS discrepancy will be enough for bounded safety proofs. The Lipschitz constants can be computed for linear, polynomial and some several other types of functions.

Proposition 9.1.

Suppose the dynamic mapping $f$ of system A is Lipschitz in both arguments. For any time bound $T>0$, $V(x, x')=|x-x'|$ is a discrepancy function with $\beta(|\theta-\theta'|,t)=e^{Lt}|\theta-\theta'|$ and $\gamma(|u-u'|)=Le^{LT}|u-u'|$. IS discrepancy functions obtain in this way will have $\beta$ and $\gamma$ exponentially growing in time.

Stable Linear Systems

Suppose A' dynamic mapping $f(x,u)=Cx+Du$, where C is an n×n matrix and D is a n×m matrix. If C is asymptotically stable, then its trajectories converge exponentially. And, we can get an IS dependency functions that are exponentially convergent.

Proposition 9.2.

For linear system A with dynamic mapping $f(x,u)=Cx+Du$ with C stable, there exists $\lambda>0$, $V(x,x')=|x-x'|$ is a discrepancy function with $\beta(|\theta-\theta'|,t)=e^{-\lambda t}|\theta-\theta'|$ and $\gamma(|u-u'|)=|D|\|u-u'|$.

The positive constant $\lambda$ can be found algorithmically through solving the Lyapunov equation.

Incremental Integral ISS

The notion of incremental integral input-to-state stability (incremental integral ISS) of dynamical systems is a generalization of the standard notions of IS stability. A Lyapunov-like theorem of proving incremental integral ISS as well as a converse Lyapunov theorem are presented in D. Angeli, "Further results on incremental input-to-state stability," *IEEE Transactions on Automatic Control*, vol. 54, no. 6, pp. 1386-1391 (2009). Given a proof of an incremental integral ISS property of a model, we get its IS discrepancy function (with witnesses) for free.

Definition 10.

A dynamical system A is called incremental integral input-to-state stable (ISS) if there exists a class-$K_\infty$ function $\alpha$, a class-KL function $\beta$ and a class-K function $\gamma$ such that, for any initial states $\theta, \theta' \in \Theta_A$, for any input signal $\eta, \eta' \in U_A$ and any $t>0$, $$|\alpha(|\xi(t)-\xi'(t)|)| \leq \beta(|\theta-\theta'|,t) + \int_0^t \gamma(|\eta(s)-\eta'(s)|)ds. \quad (9)$$

where $\xi=\text{Traj}(A,\theta,\eta)$ and $\xi'=\text{Traj}(A,\theta',\eta')$. Given an incremental integral ISS system A, we can get IS-discrepancy functions from $\beta$ and $\gamma$ in the ISS definition.

Small Approximants Form is Discrepancy

In this section we define an one-dimensional approximation for dynamical subsystems (Definition 11) that use input-to-state discrepancy functions. For the sake of a cleaner presentation, we develop the results for a dynamical system consisting of two modules with a two-dimensional approximation.

IS Approximation of $A_1 \| A_2$

Figure 9:
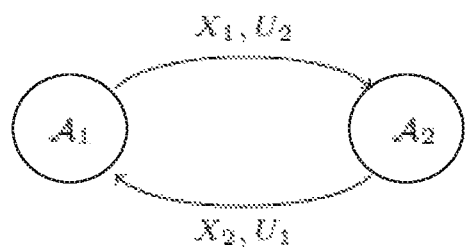
FIG. 9 is a diagram of a close dynamical system with two interacting subsystems, according to an embodiment of the present disclosure.

Consider the closed dynamical system $A=A_1 \| A_2$, with $X_1=U_2$ and $X_2=U_1$ as shown in FIG. 9. Let each subsystem $A_i, i \in \{1,2\}$ have IS discrepancy functions $\beta_i, \gamma_i$. For any pair of initial states $\theta, \theta'$ in $\Theta_A$, let $\xi=\text{Traj}(A,\theta)$ and $\xi'=\text{Traj}(A,\theta')$ be the unique trajectories starting from them. We define $\xi_i = \xi \downarrow X_i$ and $\xi'_i = \xi' \downarrow X_i$. As discussed, the restriction of $\xi_i$ and to $\xi'_i$ are trajectories of $A_i$ from $\theta \lceil X_i$ and $\theta' \lceil X_i$. From Definition 9, for every $t \in [0,T]$ the following holds:

$$V_1(\xi_1(t),\xi'_1(t)) \leq \beta_1(|\theta_1-\theta_{1'}|,t) + \int_0^t \gamma_1(|\xi_2(s)-\xi'_2(s)|)ds,$$

$$V_2(\xi_2(t),\xi'_2(t)) \leq \beta_2(|\theta_2-\theta_{2'}|,t) + \int_0^t \gamma_2(|\xi_1(s)-\xi'_1(s)|)ds. \quad (10)$$

Next, we introduce the key notion of a family of IS approximations for A. Each approximation is parameterized by nonnegative reals $\delta_1$ and $\delta_2$ and is a closed dynamical system M with two main variables, $m_1$ and $m_2$. As we shall see in Theorem 11.4, at any time t, $m_1$ gives an upper-bound on the distance between two state trajectories of $A_1$ that start from neighboring states at most $\delta_1$ apart. Similarly, $m_2$ gives an upper-bound on neighboring trajectories of $A_2$.

Of course, the distance between two neighboring state trajectories of $A_1$ depends on (a) their initial states; and (b) on the inputs they experience. These inputs, in turn, depend on the corresponding state trajectories of $A_2$. So, the dynamics of $m_1$ (and $m_2$) takes into account the impact of both of these factors using the IS discrepancy functions. Since the $\beta$ witness bounds the impact of initial states on the discrepancy as a function of time, the dynamics of $m_1$ (and $m_2$) is time varying. For convenience, we have therefore introduced a third clock variable (clk) in M.

Definition 11.

For any pair of nonnegative constants $(\delta_1,\delta_2)$, the $(\delta_1,\delta_2)$-IS approximation of A is a closed dynamical system $M = \langle X_M, \Theta_M, U_M, f_M \rangle$ where:

1. $X_M = \{m_1, m_2, \text{clk}\}$,
2. $\Theta_M = \{\theta\}$ where $\theta$ is defined by $\theta(m_i)=\beta_i(\delta_i,0)$, for $i \in [\{1,2\}$, and $\theta(\text{clk})=0$,
3. $U_M = \emptyset$, and
4. for any valuation $x \in \text{Val}(X_M)$, $$f_M(x) = \begin{bmatrix} \dot{\beta}_1(\delta_1, x(\text{clk})) + \gamma_1(x(m_2)) \\ \dot{\beta}_2(\delta_2, x(\text{clk})) + \gamma_2(x(m_1)) \\ 1 \end{bmatrix} \quad (11)$$

where $\dot{\beta}_i(\delta_i, x(\text{clk}))$ is a shorthand for $$\frac{\partial \beta_i}{\partial t}(\delta_i, x(\text{clk})).$$

The last component of $f_M$ is the constant 1 and in the initial state clk=0. It follows that along any trajectory $\mu$ of M, clk tracks the real time: $\mu(t)[\text{clk}]=t$. The witness functions $\alpha_1^{-1}, \gamma_1$, etc., are Lipschitz and Lipschitz functions are closed under composition, and therefore, $f_M$ is Lipschitz with respect to $m_1$ and $m_2$. $\beta_i(\cdot,\cdot)$ has Lipschitz derivatives in the second argument which implies that $\eta_M$ is also Lipschitz with respect to clk. Thus, M is indeed a closed, deterministic dynamical system with a single initial state and a unique trajectory. Note that both the initial state and the dynamics of M depend on the choice of the parameters $\delta_1$ and $\delta_2$. In Theorem 11.4 we relate $m_1$ and $m_2$ with the divergence between trajectories of $A_1$ and $A_2$. Specifically, if $\mu$ is the trajectory of a $(\delta_1,\delta_2)$-IS approximation, then $\mu_i = \mu \downarrow m_i(t)$ gives an upperbound on the distance between the trajectories of $A_i$ starting from initial states that are at most $\delta_i$ apart.

Over-Approximation with IS Discrepancy

Before diving into technical details, we introduce a couple of notations. For any pair of non-negative reals $\delta=(\delta_1,\delta_2)$ and any state $x \in \mathrm{Val}(X_A)$ we define $$B_\delta(x) = B_{\delta_1}\lceil x(X_1) \times B_{\delta_2}(x\lceil X_2)$$

as the product of the $\delta_i$-balls around $x\lceil X_i$. Given a pair of discrepancy functions $V=(V_1,V_2)$ for $A_1$ and $A_2$, a state $m \in \mathrm{Val}(X_M)$ of M naturally defines a sublevel set in $\mathrm{Val}(X_A) \times \mathrm{Val}(X_A)$. In what follows, we denote by $L_V(m) \subseteq \mathrm{Val}(X_A) \times \mathrm{Val}(X_A)$, the set $$\{(x,x') | \forall i \in \{1,2\}, V_i(x\lceil X_i), x'\lceil X_i) \le m\lceil m_i\}.$$

This set is the intersection of the $(m\lceil m_1)$-sublevel sets of $V_i$. For a state $x \in \mathrm{Val}(X_A)$ $\mathrm{Val}(X\_A)$ of A and a state $m \in \mathrm{Val}(X_M)$ $\mathrm{Val}(X\_M)$ we define $$B_m^V(x) = \{x' \in \mathrm{Val}(X_A)\mathrm{Val}(X_A) | (x,x') \in L_V(m)\}$$

as the subset of states of A for which $(x,x')$ lies in the sublevel set defined by m.

We ultimately show that the trajectory of M always upper bounds the right-hand side of Equation (12), that is, $$\mu_1(t) \ge \beta_1(|\theta_1-\theta_{1'}|,t) + \int_0^t \gamma_1(|\xi_2(s)-\xi_{2'}(s)|)ds,$$

$$\mu_1(t) \ge \beta_1(|\theta_2-\theta_{2'}|,t) + \int_0^t \gamma_2(|\xi_1(s)-\xi_{1'}(s)|)ds. \quad (12)$$

From the construction of M, we observe that at time $t=0$, the above inequalities hold. Moreover, the first derivatives of the left-hand sides upper bound those of the right-hand sides at time $t=0$. However, this property at $t=0$ cannot immediately be generalized to all $t>0$. In our proof, we first construct a strict upper bound of the right-hand sides of (12) that holds for all t, and then show that this bound converges to $\mu(\bullet)$.

First, for any positive $\varepsilon > 0$, we construct a pair of $\varepsilon$-factor trajectories $(\mu_{1\varepsilon}, \mu_{2\varepsilon})$ with derivatives $\varepsilon$-close to the first two components of $f_M$ and show that these trajectories strictly upper-bound the discrepancy functions of $V_1$ and $V_2$.

For any $\delta_1, \delta_2 \ge 0$ and any $\varepsilon > 0$, a pair of trajectories $\mu_{1\varepsilon}, \mu_{2\varepsilon}: R_{\ge 0} \mapsto R_{\ge 0}$ are defined as solutions to the differential equations:

$$\dot\mu_{1\varepsilon} = \dot\beta_1(\delta_1,t) + \gamma_1(\mu_{2\varepsilon}) + \varepsilon, \text{ and} \quad (13)$$

$$\dot\mu_{2\varepsilon} = \dot\beta_2(\delta_2,t) + \gamma_1(\mu_{1\varepsilon}) + \varepsilon, \quad (14)$$

with $\mu_{1\varepsilon}(0) = \beta_1(\delta_1,0) + \varepsilon$ and $\mu_{2\varepsilon}(0) = \beta_2(\delta_2,0) + \varepsilon$. The right-hand side of Equation (13) is Lipschitz, and therefore, $\mu_{1\varepsilon}$ and $\mu_{2\varepsilon}$ are well-defined. For any two initial states of A $\theta, \theta'$, we define two differentiable functions $g_1, g_2: R^{\ge 0} \mapsto R$:

$$g_1(t) = \mu_{1\varepsilon}(t) - \beta_1(\delta_1,t) - \int_0^t \gamma_1(|\xi_2(s)-\xi_{2'}(s)|)ds,$$

$$g_2(t) = \mu_{2\varepsilon}(t) - \beta_2(\delta_2,t) - \int_0^t \gamma_2(|\xi_1(s)-\xi_{1'}(s)|)ds. \quad (15)$$

Recall that $\xi = \mathrm{Traj}(A,\theta)$ and $\xi' = \mathrm{Traj}(A,\theta')$ are the trajectories of A starting from and $\theta$ and $\theta'$.

Proposition 11.1

Consider any non-negative pair $\xi = (\delta_1, \delta_2)$ and initial states $\theta, \theta' \in \Theta_A$ such that $\theta' \in B_\delta(\theta)$. Let $\xi = \mathrm{Traj}(A,\theta)$ and $\xi' = \mathrm{Traj}(A,\theta')$. Then, for any $\varepsilon > 0$, $t \ge 0$, if $g_1(t), g_2(t) > 0$, then $$V_1(\xi_1(t), \xi'_1(t)) < \mu_{1\varepsilon}(t), \text{ and } V_2(\xi_2(t), \xi'_2(t)) < \mu_{2\varepsilon}(t).$$

Proof.

Here we prove the bound for $V_1$; the bound for $V_2$ follows by symmetry. For any $t \ge 0$, since $g_1(t) > 0$, $$\mu_{1\varepsilon}(t) > \beta_1(\delta_1,t) + \int_0^t \gamma_1(|\xi_2(s)-\xi_{2'}(s)|)ds. \quad (16)$$

From $\theta' \in B_\delta(\theta)$, we have $|\theta_1 - \theta'_1| \le \delta_1$. Since $\beta_1(\bullet,t)$ is a class-K function, it follows that $\beta_1(\delta_1,t) \ge \beta_1(|\theta_1-\theta'_1|,t)$.

Thus, Equation (16) becomes $$\mu_{1\varepsilon}(t) > \beta_1(|\theta_1-\theta'_1|,t) + \int_0^t \gamma_1(|\xi_2(s)-\xi_{2'}(s)|)ds.$$

By applying Equation (10), it follows that $$\mu_{1\varepsilon}(t) > \beta_1(|\theta_1-\theta'_1|,t) + \int_0^t \gamma_1(|\xi_2(s)-\xi_{2'}(s)|)ds \ge V_1(\xi_1(t), \xi_{1'}(t)).$$

The next lemma establishes that we can drop the assumption about the positivity of $g_1$ and $g_2$ and still arrive at the conclusion of Proposition 11.1.

Lemma 11.2.

Consider any non-negative pair $\delta = (\delta_1, \delta_2)$, and initial states $\theta, \theta' \in \Theta_A$ such that $\theta' \in B_\delta(\theta)$. Let $\xi = \mathrm{Traj}(A,\theta)$ and $\xi' = \mathrm{Traj}(A,\theta')$. Thus, for any $\varepsilon > 0, t \ge 0$, $V_1(\xi_1(t), \xi'_1(t)) < \mu_{1\varepsilon}(t)$ and $V_2(\xi_2(t), \xi'_2(t)) < \mu_{2\varepsilon}(t)$.

Proof.

By Proposition 11.1, it suffices to prove that for all $t \ge 0$, $g_1(t), g_2(t) > 0$. At $t=0$, $$g_1(0) = \beta_1(\delta_1,0) + \varepsilon - \beta_1(\delta_1,0) = \varepsilon > 0.$$

Similarly, $g_2(0) > 0$. Suppose for the sake of contradiction that $t_a > 0$ is the first time when $g_1(t), g_2(t) > 0$ is violated. From the continuity of $g_1, g_2$, we have that the both following conditions hold:

1. $g_1(t), g_2(t) > 0$ for all $t \in [0, t_a)$, and
2. $g_1(t_a) = 0$ or $g_2(t_a) = 0$.

Without loss of generality, we assume $g_1(t_a) = 0$. From the mean value theorem, there exists some time $t_b \in (0, t_a)$ such that $$\dot g_1(t_b) = \frac{g_1(0) - g_1(t_a)}{0 - t_a} \le \frac{\varepsilon}{t_a} < 0. \quad (17)$$

We can bound the derivative $\dot g_1(t_b)$ as:

$$\dot g_1(t_b) = \dot\mu_{1\varepsilon}(t_b) - \frac{d}{dt}\left(\beta_1(\delta_1, t_b) + \int_0^{t_b} \gamma_1(|\xi_2(s) - \xi_{2'}(s)|)ds\right).$$

Plugging the right-hand side of Equation (13) into the above equation, it follows:

$$\dot g_1(t_b) = \dot\beta_1(\delta_1, t_b) + \gamma_1 \circ \alpha_2^{-1}(\mu_{2\varepsilon}(t_b)) + \varepsilon \quad (18)$$

$$- \dot\beta_1(\delta_1, t_b) - \gamma_1(|\xi_2(t_b) - \xi_{2'}(t_b)|)$$

$$= \varepsilon + (\gamma_1 \circ \alpha_2^{-1}(\mu_{2\varepsilon}(t_b)) - \gamma_1(|x_2(t_b) - x_{2'}(t_b)|)).$$

From condition (7), we know $g_2(t_b) > 0$. It follows from Proposition 11.1 that $$\mu_{2\varepsilon}(t_b) > V_2(\xi_2(t_b), \xi'_2(t_b)). \quad (19)$$

From Definition 10, we have $V_2(\xi_2(t_b), \xi'_2(t_b)) \ge \alpha_2(|\xi_2(t_b) - \xi'_2(t_b)|)$. Equation (19) yields $\mu_{2\varepsilon}(t_b) > \alpha_2(|\xi_2(t_b) - \xi'_2(t_b)|)$. Because $\gamma \circ \alpha_2^{-1}$ is a class-K function, it follows that $\gamma_1 \circ \alpha_2^{-1}(\mu_{2\varepsilon}(t_b)) \ge \gamma_1(|\xi_2(t_b) - \xi'_2(t_b)|)$.

Combining the above equation with Equation (19), we have that $\dot g_1(t_b) \ge 0$, which contradicts Equation (17).

Lemma 11.2 shows that for any $\varepsilon > 0$, the $\varepsilon$-factor trajectories $\mu_{1\varepsilon}$ and $\mu_{2\varepsilon}$, give strict upper bounds on the distance between corresponding trajectories of $A_1$ and $A_2$. In the following lemma, we show that as $\varepsilon \to 0$, $\mu_{i\varepsilon}$ converges to the trajectory $\mu \downarrow m_i$. Recall that $\mu$ is the trajectory of the IS approximation M. It follows that the trajectory μ indeed bounds the divergence of any trajectories of A.

Lemma 11.3.

Consider any non-negative pair $\delta=(\delta_1,\delta_2)$ and initial states $\theta,\theta'\in\Theta_A$ such that $\theta'\in B_\delta(\theta)$. Let $\xi=\text{Traj}((A,\theta))$, $\xi'=\text{Traj}((A,\theta'))$, and μ be the trajectory of A's $(\delta_1,\delta_2)$-IS approximation M. Then for all $t\geq 0$, $$(\xi(t),\xi'(t))\in L_V(\mu(t)).$$

Proof.

For brevity we write $\mu\downarrow m_i$ as $\mu_i$ and $\mu\downarrow\text{clk}$ as clk. Recall, we have $\text{clk}(t)=t$. Rewriting the condition that the solution μ of M satisfies the differential equation defined by $f_M$, we have $$\dot{\mu}_1(t) = \dot{\beta}_1(\delta_1, t) + \gamma_1 \circ \underline{\alpha}_2^{-1}(\mu_2(s))ds, \quad (20)$$

$$\dot{\mu}_2(t) = \dot{\beta}_2(\delta_2, t) + \gamma_2 \circ \underline{\alpha}_1^{-1}(\mu_1(s))ds,$$

$$\dot{clk}(t) = 1.$$

By integrating both sides with initial condition $\mu_1(0)=\beta_1(\delta_1,0)$ and $\mu_2(0)=\beta_2(\delta_2,0)$, we have, $$\mu_1(t) = \beta_1(\delta_1, t) + \int_0^t \gamma_1 \circ \underline{\alpha}_2^{-1}(\mu_2(s))ds, \quad (21)$$

$$\mu_2(t) = \beta_2(\delta_2, t) + \int_0^t \gamma_2 \circ \underline{\alpha}_1^{-1}(\mu_1(s))ds,$$

$$clk(t) = t.$$

Similarly, by integrating Equation (13), we have $$\mu_{1\varepsilon}(t)=\beta_1(\delta_1,t)+\int_0^t\gamma_1\circ\underline{\alpha}_2^{-1}(\mu_{2\varepsilon}(s))ds+\varepsilon(1+t)$$

$$\mu_{2\varepsilon}(t)=\beta_2(\delta_1,t)+\int_0^t\gamma_1\circ\underline{\alpha}_1^{-1}(\mu_{1\varepsilon}(s))ds+\varepsilon(1+t).$$

Define $h(t)\doteq|\mu_1(t)-\mu_{1\varepsilon}(t)|+|\mu_2(t)-\mu_{2\varepsilon}(t)|$. Plugging in Equation (21) and (22) into the definition of h(t), we have:

$$h(t)\leq 2\varepsilon(t+1)+\int_0^t|\gamma_1\circ\underline{\alpha}_2^{-1}(\mu_{1\varepsilon}(s))-\gamma_1\circ\underline{\alpha}_2^{-1}(\mu_1(s))|ds+\int_0^t|\gamma_2\circ\underline{\alpha}_1^{-1}(\mu_{2\varepsilon}(t))-\gamma_2\circ\underline{\alpha}_1^{-1}(\mu_2(t))|ds.$$

From the Lipschitz property of $\gamma_1\circ\underline{\alpha}_2^{-1}$ and $\gamma_2\circ\underline{\alpha}_1^{-1}$, we can find a constant $L>0$ such that $|\gamma_1\circ\underline{\alpha}_2^{-1}(\mu_1(s))-\gamma_1\circ\underline{\alpha}_2^{-1}(\mu_1(s))|\leq L|\mu_1(t)-\mu_{1\varepsilon}(t)|$ and $|\gamma_2\circ\underline{\alpha}_1^{-1}(\mu_2(s))-\gamma_2\circ\underline{\alpha}_1^{-1}(\mu_2(s))|\leq L|\mu_2(t)-\mu_{2\varepsilon}(t)|$. It follows that $$h(t)\leq 2\varepsilon(t+1)+\int_0^t Lh(s)ds.$$

By Gronwall-Bellman inequality, it follows that $$h(t)\leq 2\varepsilon(t+1)+2\varepsilon L\int_0^t Lh(s)ds.$$

It follows that for any $t\in R^{\geq 0}$, the integral $\int_0^t(s+1)e^{L(t-s)}ds$ is bounded. Thus $h(t)\to 0$ as $\varepsilon\to 0$, which implies both $|\mu_1(t)-\mu_{1\varepsilon}(t)|$ and $|\mu_2(t)-\mu_{2\varepsilon}(t)|$ converge to zero ("0"). Using Lemma 5.2, and taking the limit of $\varepsilon\to 0$, it follows that $$V_1(\xi(t),\xi_1(t))\leq\mu_1(t) \text{ and } V_2(\xi(t),\xi_2(t))\leq\mu_2(t).$$

That is, for any $t\geq 0$, $(\xi(t),\xi'(t))\in L_V(\mu(t))$.

Theorem 11.4 states that the reach set of any (large) dynamical system $A=A_1\|A_2$ from a set of states can be overapproximated by bloating an individual execution ξ of A by a factor that is entirely determined by (a) IS discrepancy functions $V_1$ and $V_2$ of its (smaller) subsystems; and (b) the trajectory μ of a (small, 2-dimensional) dynamical system M that is its IS approximation.

Theorem 11.4.

Consider a closed dynamical system $A=A_1\|A_2$ with IS discrepancy functions $V=(V_1,V_2)$. Let $\xi=\text{Traj}(A,\theta)$ for some initial state $\theta\in\Theta_A$. For any nonnegative pair $\delta=(\delta_1,\delta_2)$ suppose is the trajectory of the $(\delta_1,\delta_2)$-IS approximation M. Then, for any $T\geq 0$ $$\text{Reach}_A(B_\delta(\theta),T)\subseteq\bigcup_{t\in[0,T]}B_{\mu(t)}^V(\xi(t)).$$

Proof.

For any $x\in\text{Reach}_A(B_\delta(\theta),T)$, there exists an initial state $\theta'\in B_\delta(\theta)$, a trajectory $\xi'=\text{Traj}(A,\theta')$ and a time $t\in[0,T]$ such that $\xi'(t)=x$. It follows Lemma 11.3 that $(\xi(t),\xi'(t))\in L_V(\mu(t))$, and therefore, $x\in B_{\mu(t)}^V(\xi(t))$.

Theorem 11.4 establishes an overapproximation of set of reachable states from a δ-ball $B_\delta(\theta)$. To compute the set of reachable state from a compact initial set $\Theta_A$, we can first compute a δ-cover of $\Theta_A$, and then compute the union of reach set of the covers. Theorem 11.4 does not require A to be stable or any global property to hold for the IS discrepancy functions. To use Theorem 11.4, we need to (a) find IS discrepancy functions for the subsystems, and (b) compute individual executions ξ of A and μ of M (both trajectories). For large classes of nonlinear dynamical systems there exist scalable numerical techniques for computing (b). This is one of the motivations of the present work. For linear and some special classes of nonlinear systems, (a) can be solved automatically (see "Finding IS Discrepancy" section).

Precision of IS Approximation

The precision of the above referenced overapproximation can be determined by $|\mu(t)|$. In the following, we show that the precision can be made arbitrarily high with sufficiently small but positive $\delta_1, \delta_2$.

Lemma 11.5.

Consider any $T>0$, $t\in[0,T]$, and a sequence of pairs of positive reals $\delta^k=(\delta_1^k,\delta_2^k)$ converging to (0,0). For the trajectory $(\mu^k)$ of the corresponding $(\delta_1^k,\delta_2^k)$-IS approximation $M^k$, $|\mu^k\downarrow m_i(t)|\to 0$ for $i\in\{1,2\}$.

Proof.

Fix a $T>0$ and $\delta^k=(\delta_1^k,\delta_2^k)$. This defines the $(\delta_1^k,\delta_2^k)$-IS approximation $M^k$ and its trajectory $\mu^k$. We will prove that for all $t\in[0,T]$, $$|(\mu^k\downarrow m_1)(t)|+|(\mu^k\downarrow m_2)(t)|\to 0,$$

as $\delta^k\to 0$. From here on out, we drop the superscript k and use the notations setup earlier: $\mu_i=\mu\downarrow m_i$, etc.

From the first row in Equation (21), we have that $$|\mu_1(t)|\leq\beta_1(\delta_1,t)+\int_0^t\gamma_1\circ\underline{\alpha}_2^{-1}(\mu_2(s))ds \quad (24)$$

From the Lipschitz property of $\gamma_1\circ\underline{\alpha}_2^{-1}$, there exists some $L_1>0$, such that $|\gamma_1\circ\underline{\alpha}_2^{-1}(\mu_2(s))-\gamma_1\circ\underline{\alpha}_2^{-1}(0)|\leq L|\mu_2(s)-0|$. Since $\gamma_1\circ\underline{\alpha}_2^{-1}$ is of class-K, it follows that $$|\gamma_1\circ\underline{\alpha}_2^{-1}(\mu_2(s))|\leq L|\mu_2(s)|.$$

From Equation (21), we observe that $i\in\{1,2\}$ $\mu_i(t)$ are nonnegative scalers. We drop the absolute value symbols |•|. Then Equation (24) reduces to $$|\mu_1(t)|\leq\beta_1(\delta_1,t)+\int_0^t L|\mu_2(s)|ds \quad (25)$$

Since $\beta_1(\delta_1,t)$ is bounded in compact intervals, we define $$B_1^T(\delta_1) = \sup_{t\in[0,T]}\beta_1(\delta_1, t), \quad (26)$$

as the upper bound of the function $\beta_1(\bullet,t)$ in interval $t \in [0,T]$. It follows from Equation (25) that $$|\mu_1(t)| \le B_1^T(\delta_1) + \int_0^t L|\mu_2(s)|ds \qquad (27)$$

Starting from the second row of Equation (21), by following similar steps from Equation (24)-(27), we have:

$$|\mu_2(t)| \le B_2^T(\delta_2) + \int_0^t L|\mu_1(s)|ds \qquad (28)$$

Summing up Equation (27) and (28), by applying Gronwall-Bellman inequality, we have $$|\mu_1(t)| + |\mu_2(t)| \le B_1^T(\delta_1) + B_2^T(\delta_2))e^{Lt}.$$

For $i \in \{1,2\}$, since $\beta_i(\bullet,\bullet)$ is a class-K function in the first argument, it follows from Equation (26) that $B_i(\delta_i^k) \to 0$ as $\delta_i^k \to 0$. It follows that, $|\mu_1^k(t)| + |\mu_2^k(t)| = 0$ as $\delta^k 0$.

Proposition 11.6 follows from the fact that for $i \in \{1,2\}$, for any $x, x' \in X_i$, $\alpha_i(x-x') \le V_i(x,x')$ (Definition 9).

Proposition 11.6.

For dynamical system A with discrepancy function $V_1, V_2$, fix any $x \in X_A$. For any $\varepsilon > 0$, there exist $r > 0$, such that $B_r^V(x) \subseteq B_\varepsilon(x)$.

With Lemma 11.5 and Proposition 11.6, the following theorem is straightforward.

Theorem 11.7.

Consider a closed dynamical system $A = A_1 \| A_2$ with IS discrepancy $V = \{V_1, V_2\}$. Let $\xi = \text{Traj}(A, \theta)$ for some initial state $\theta \in \Theta_A$. For any $\varepsilon > 0$, there exists a positive pair $\delta_1, \delta_2 > 0$ such that, for A's $(\delta_1, \delta_2)$-IS approximation M, for any $T \ge 0$ $$\bigcup_{t \in [0,T]} B_{\mu(t)}^V(\xi(t)) \subseteq B_\varepsilon(\text{Reach}_A \text{Reach}_A(B_\delta(\theta), T)),$$

where $\mu$ is the unique trajectory of M.

If the overapproximation obtained from Theorem 11.4 is not precise enough to prove safety, then, we can refine the parameters $\delta_1$ and $\delta_2$. Then we can compute $B_{\mu(t)}^V(\xi(t))$ for each of the smaller partitions with higher precision. This is the approach used for developing the verification algorithm 1000 of FIG. 10.

Approximations for $A_1 \| A_2 \| \ldots A_N$

The approximation and its analysis presented in the previous section can be extended to a closed systems with N components: $A = A_1 \| A_2 \ldots \| A_N$. For any trajectories $\xi, \xi' \in \text{Traj}(A, \Theta)$, and for each $i \in [N]$, we define $\xi_i = \xi \downarrow X_i$ and $\xi'_i = \xi \downarrow X_i$.

The natural generalization of Definition 9 to a set of discrepancy functions according to the composition topology for A is given below:

Definition 12.

A set of input-to-state (IS) discrepancy functions of A is a set of continuous functions $V = \{V_i\}_{i \in [N]}$ with class-K witnesses $\{(\alpha_i, \overline{\alpha}_i, \beta_i)\}_{i \in [N]}$ and $\{\gamma_{ji}\}_{(j,i): X_j \cap U_i \ne \emptyset}$, where for any $\theta, \theta' \in \Theta_A$, for each $t \ge 0$ each $i \in [N]$ $$V_i(\xi_i(t), \xi_{i'}(t)) \le \beta_i(|\xi_i(0) - \xi_{i'}(0)|, t) + \int_0^t \sum_{j: X_j \cap U_i \ne \emptyset} \gamma_{ji}(|\xi_j(s) - \xi_{j'}(s)|)ds,$$

where $\xi = \text{Traj}(A, \theta)$ and $\xi' = \text{Traj}(A, \theta')$.

The set $\{A_j | X_j \cap U_i \ne \emptyset\}$ is the set of modules that provide inputs to module $A_i$. Similar to Definition 9, Definition 12 requires that each module $A_i$ is associated with discrepancy functions $\beta_i, \gamma_i$. Furthermore, each pair $(A_j, A_i)$, where part of the inputs from $A_i$ comes from $A_j$'s state, is associated with a function $\gamma_{ji}$. Generalizing Definition 11, the IS approximation of A is a (N+1)-dimensional closed deterministic dynamical system M.

Definition 13.

For any $\delta = (\delta_1, \ldots, \delta_N) \in (R_{\ge 0})^N$, the $\delta$-IS approximation of A is a closed dynamical system $M = \langle X_M, \Theta_M, U_M, f_M \rangle$, where:

1. $X_M = \{m_1, m_2, \ldots, m_N, \text{clk}\}$,
2. $\Theta_M = \{\theta\}$, where $\theta$ is defined by $\theta(m_i) = \beta_i(\delta_i, 0)$, for $i \in [N]$, and $\theta(\text{clk}) = 0$,
3. $U_B = \emptyset$,
4. For any valuation $x \in \text{Val}(X_M)$ Val(X_M) and each $i \in [N]$:

$$f_M \downarrow m_i(x) = \beta_i(\delta_i, x(\text{clk})) + \sum_{j: X_j \cap U_i \ne \emptyset} \gamma_{ji} \circ \alpha_j^{-1}(x(m_j)),$$
$$f_M \downarrow \text{clk}(x) = 1.$$

For any state $m \in \text{Val}(X_M)$, the intersection of all sublevel sets of $\{V_i\}_{i \in [N]}$ is denoted as $L_r(m)$ as a generalization of the $A_1 \| A_2$ case. The IS approximation M is N+1-dimensional. Construction of M can use (a) information of individual modules (IS discrepancy functions and the like) and (b) the topology of the composition. No additional information about the behavior of the composed system A is needed. It follows that for a closed composed system $A = A_1 \| \ldots A_N$ and its IS approximation M, the conclusions of Theorems 11.4 and 11.7 hold with the apparent changes.

From Simulations to Proofs

In the above section, from a closed dynamical system A composed of N subsystems and a set of IS discrepancy functions for the subsystems, we constructed an (N+1)-dimensional IS approximation M. With Theorem 11.4, by computing trajectories $\xi = \text{Traj}(A, \theta)$ of A and trajectories $\mu$ of M, we can compute overapproximations $\text{Reach}_A(B_\delta(\theta), T)$. Computing precise overapproximations of $\text{Reach}_A(\Theta_A, T)$ can reduce to computing finitely many trajectories of A and Ms which can be accomplished using numerical ODE solvers. In this section, we present a safety verification algorithm using this idea.

Simulations of Dynamical Systems

Given a closed dynamical system A, an initial state $\theta$, let $\xi = \{A, \theta\}$. For a step size $\tau > 0$, validated ODE solvers compute a sequence of boxes $R_1, R_2, \ldots, R_l \subseteq \text{Val}(X_A)$, such that for each $k \in [l]$, $t \in [(k-1)\tau, k\tau]$, $\xi(t) \in R_k$. For a desired error bound $\varepsilon > 0$, by reducing the step size $\tau$, the diameter of $R_k$ can be made smaller then $\varepsilon$. We capture such simulation trace in the definition below.

Definition 14.

Given a dynamical system A, an initial state $\theta$, a time bound T, an error bound $\varepsilon > 0$, and time step $\tau > 0$, for $\xi = \text{Traj}(A, \theta)$, a $(\theta, T, \varepsilon, \tau)$-simulation trace is a finite sequence $\phi = (R_0, t_0), (R_1, t_1), \ldots, (R_l, t_l)$ where:

1. $t_0 = 0$, $t_l = T$, and $\forall k \in [l]$, $t_i - t_{i-1} \le \tau$,
2. $\forall k \in [l]$ and $\forall t \in [t_{k-1}, t_k]$, $\xi(t) \in R_k$, and
3. $\forall k \in [l]$, $\text{dia}(R_k) \le \varepsilon$.

In the algorithm 1000 of FIG. 10, the subroutine Simulate $(A, \theta, T, \varepsilon, \tau)$ (line 6) computes a $(\theta, T, \varepsilon, \tau)$-simulation as defined in Definition 14. For the completeness of the algorithm, we require that for any precision parameters $\varepsilon, \tau > 0$, a simulation trace fulfill such precision can be computed.

Verification Algorithm

We introduce the algorithm 1000 of FIG. 10 to verify a closed composed system $A = A_1 \| \ldots \| A_N$. Let each subsystem $A_i$ be equipped with discrepancy functions $\beta_i, \gamma_{ij}$. The set C computed in line 6 is a finite set of triples $\{(\theta_c, \delta, \varepsilon)\}_{c \subseteq |C|}$, such that $\{\theta_c\}_{c \subset |C|}$ is a $\delta$-cover of the initial set $\Theta_A$. Each $\theta_c$ is associated with precession parameter $\varepsilon > 0$ and positive real-valued vector $\delta$. For each triple $(\theta, \delta, \varepsilon)$ in the cover set C, an $\delta$-IS approximation M (line 6) is constructed following Definition 13.

The Simulate( ) (line 6) function is used in two ways:

1. Computing a simulation trace $\psi = <R_0, t_0>, \ldots, <R_p, t_p>$ containing the trajectory $\xi = \text{Traj}(A, \theta)$ of the (large) dynamical system A, and 2. Computing a simulation trace $\phi = <Q_0, t_0>, \ldots, <Q_p, t_p>$ of the trajectory $\mu = \text{Traj}(M, \theta_M)$, of the (smaller) IS approximation M.

Here we assume the time stamps of the sequence cit matches up with that of $\phi$. This can be achieved by using a fixed step solver or through resimulating using smaller step sizes. The sequence $\rho$ computed in line 6 is a sequence of the pair $<r_0, t_0>, \ldots, <r_p, t_p>$, where for each $k \in [p]$, $r_k$ is a nonnegative real defined as $r_k = \sup_{m \in Q_k} |m|$. In line 6, the sequence of sets $\{R_k\}$ is bloated by the sequence of factors $\{r_k\}$ element-wise to construct a tube S. We claim that the tube S contains the set of reachable state of A from the set of initial state $B_\delta(\theta)$. Then the algorithm checks whether this tube is safe or not, or further refinement is needed.

Analysis of Verification Algorithm (FIG. 10)

We establish the soundness and relative completeness of the algorithm 1000 of FIG. 10 in Theorems 12.3 and 12.4.

Proposition 12.1.

For any $(\theta, \delta, \varepsilon) \in C$, $\xi \in \text{Traj}(A, B_\delta(\theta))$ and $t \in [t_{k-1}, t_k]$: $\xi(t) \in B_{r_k}^V(R_k)$.

This follows directly from Theorem 11.4. It also straightforward to check the following invariant of the algorithm 1000 of FIG. 10.

Proposition 12.2.

For compact initial set $\Theta_A$, during a run of Algorithm 6.2, C is finite. And, $\cup_{(\theta, \delta, \varepsilon) \in C} B_\delta(\theta) \subseteq \Theta_A$.

Theorem 12.3.

The algorithm 1000 of FIG. 10 is sound. That is, if it returns SAFE then A is safe up to T, and if it returns UNSAFE, then A is unsafe.

Proof.

Suppose the algorithm 1000 returns SAFE. For any cover $(\theta, \delta, \varepsilon) \in C$, S computed in line 6 is the union of a sequence of regions $\{B_{r_k}^V(R_k)\}$. It follows from Proposition 12.1 that $\text{Reach}_A(B_\delta(\theta), T) \subseteq S$. Thus if $S \cap Y \, U = \emptyset$, then $\text{Reach}_A(B_\delta(\theta)) \cap Y \, U = \emptyset$. The algorithm returns SAFE if all such covers are checked safe. From Proposition 12.2, we conclude $\text{Reach}_A(\Theta_A, T) \cap Y \, U = \emptyset$.

Otherwise if the algorithm returns UNSAFE, there exists at least one set $R_k$ contained in the unsafe set U. It follows from Proposition 12.1 that for the trajectory $\xi = \text{Traj}(A, \theta)$ and some $t \in [t_{k-1}, t_k]$, $\xi(t) \in U$.

Theorem 12.4.

The algorithm 1000 of FIG. 10 is relatively complete. That is, if A is robustly safe then the algorithm terminates and returns SAFE and if A is unsafe, then it terminates and returns UNSAFE.

Proof.

Suppose that for some $\varepsilon' > 0$, A is $\varepsilon'$-robustly safe up to time T. It follows from Definition 7 that $$B_{\varepsilon'}(\text{Reach}_A \text{Reach}_A(\Theta_A, T)) \cap YY = \emptyset.$$

It follows that line 6.2 is never executed. For any $\theta \in \Theta$, we will show that for small enough refinement parameters $\delta, \varepsilon > 0$, for any k, $\text{dia}(B_{r_k}^V(R_k)) < \varepsilon'$. From Proposition 5.6, we can show that exists $e > 0$ such that for $r_k < e$, $$B_{r_k}^V(R_k) \subseteq B_{\varepsilon'/3}(R_k). \tag{29}$$

From Lemma 5.5, there exists a $\delta > 0$, for all $t \in [0, T]$, $\forall i \in [N]$, $|\mu(t)| \leq e/2$. For a simulation trace $\phi = <M_0, t_0>, \ldots, <M_q, t_q>$ (line 6.2), for $\varepsilon \leq e/2$, it follows from Definition 9 that for all $k \in [q]$, the diameter $\text{dia}(M_k) \leq e/2$. Thus for any $k \in [q]$, $r_k = \sup_{m \in M_k} |m| \leq \varepsilon + \sup_{t \in [t'_{l-1}, t'_l]} |\mu(t)| \leq e/2 + e/2 = e$. It follows from Equation (23) that by choosing $\delta \leq d$ and $\varepsilon \leq e/2$, we have $B_{r_k}^V(R_k) \subseteq B_{\varepsilon'/3}(R_k)$. Notice that the diameter of $R_k$ is bounded by the refinement parameter $\varepsilon$. By choosing $\varepsilon = \min\{\varepsilon'/3, e\}$, it follows that $$\text{dia}(B_{\varepsilon'/3}(R_k)) \leq \varepsilon'/3 + \text{dia}(R_k) \leq \varepsilon'/3 + \varepsilon'/3 < \varepsilon'.$$

Thus, after a number of $\max\{\log(\frac{\varepsilon_0}{\min\{\varepsilon'/3, e\}}), \log\frac{\delta_0}{d}\}$ refinements, the parameters $\delta, \varepsilon$ are small enough to guarantee that $S \cap Y \, U = \emptyset$. Thus the algorithm returns SAFE.

On the other hand, suppose A is unsafe with respect to an open unsafe set Y U. There exists an initial state $\theta$, a time $t \leq 0$ and a $\varepsilon' > 0$ such that $B_{\varepsilon'} \xi(\theta, t) \subseteq U$. For the same number of refinement as the robustly safe case, it can be shown that there exists an $B_{r_k}^V(R_k) \subseteq B_{\varepsilon'} \xi(\theta, t)$. It follows that the algorithm returns UNSAFE.

Experimental Validation

We have created a prototype implementation of the algorithm 1000 of FIG. 10 in Matlab using the built-in ODE solvers. Currently, we assume that the error bounds of the computation in line 6 are indeed met by the Matlab's ODE solver. To make this step rigorous, in the future, we will use a validated ODE solver.

We verify the safety of several linear and nonlinear models. Each module in the linear synchronization examples is a 4-dimensional linear dynamical system and the overall system is composed of several modules in different topologies.

The nonlinear water tank network example is a modified version of the one presented in X. Chen, E. Abrahám, and S. Sankaranarayanan, "Taylor model flowpipe construction for non-linear hybrid systems," in *Real-Time Systems Symposium (RTSS)*, 2012 IEEE 33rd., pp. 183-192 (2012). In this example, each module captures the fluid levels in a group of tanks, which depends on the flows from other groups of tanks.

The closed loop robotic arm system consists of two modules: a 4-dimensional model of the robotic arm, and a 2-dimensional adaptive controller. For the 4-dimensional robotic arm example, see D. Angeli, E. D. Sontag, and Y. Wang, "A characterization of integral input-to-state stability," *Automatic Control, IEEE Transactions on*, vol. 45, no. 6, pp. 1082-1097 (2000).

We perform several experiments for time bound T=20 s on a Intel i5-3470 CPU. The columns in the table of FIG. 11 present the system being verified, the number of total state variables, the number of modules, the number of covers for the initial set, the total number of simulation boxes generated, and the running time of the algorithm. In the table of FIG. 11, the columns represent: (1) the system being verified, (2) number state variables, (3) number of modules, (4) number of covers of initial set, (5) number of total simulation boxes, and (6) run time in seconds.

Our experimental results show that the running time roughly scales linearly with the total number of simulation boxes generated for both the original system A and its IS approximation M. The number of simulation boxes generated is proportional to the product of the total number of covers and the time bound. Fixed a compact initial set, the number of covers generated depends on the level of precision needed to prove (or disprove) safety, which depends on the distance between the unsafe set to the reachable states.

We also observe that the dimension and non-linearity of the system does not explicitly influence the running time.

The technique we present for proving bounded time safety properties of (possibly unstable) nonlinear dynamical systems uses numerical simulations and IS discrepancy functions for the subsystems. IS discrepancy of a subsystem $A_i$, bounds the distance between two (possibly diverging) trajectories of $A_i$ in terms of their initial states and input signals. It is closely related to the notion of input-to-state stability that is well studied in control theory, but importantly, does not require the subsystems or the overall system to be stable. Consequently, our construction of the low dimensional dynamical system $M(\delta)$ that gives a bound on the divergence of trajectories of A, does not rely on any global properties like small gain of the interconnection nor stability of A, but instead uses the individual discrepancy functions and the numerical simulations of A and $M(\delta)$. Further, we also show that by choosing appropriately small S's the overapproximations can be made arbitrarily precise; and therefore our verification algorithm is sound and relatively complete.

Figure 12:
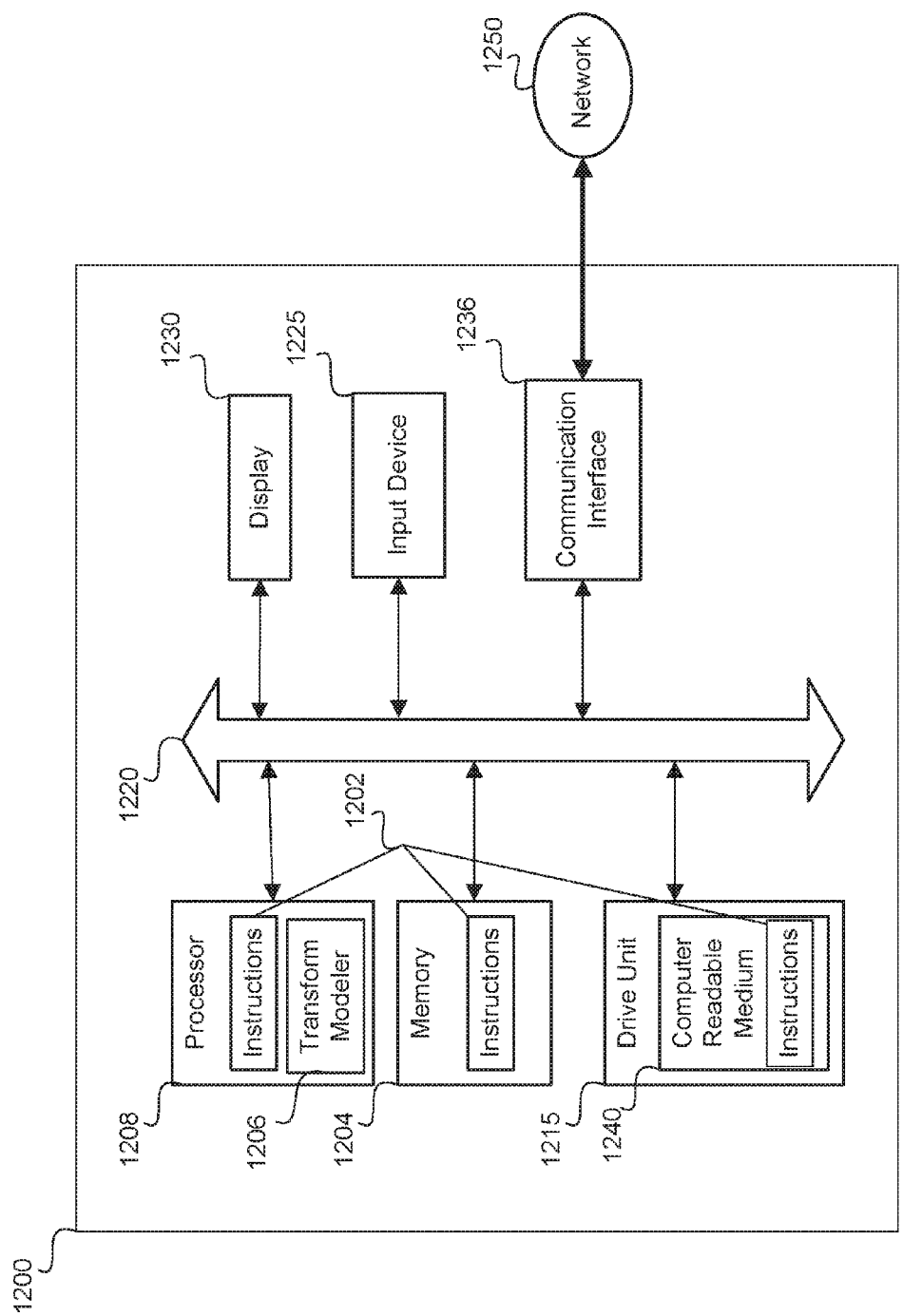
FIG. 12 is a computing system that may be used for executing ripple cancellation and jamming according the embodiments disclosed herein.

FIG. 12 illustrates a computer system 1200, which may represent aspects of the computing device 100 or any other device or system which is capable of executing the embodiments as disclosed herein. The computer system 1200 may include an ordered listing of a set of instructions 1202 that may be executed to cause the computer system 1200 to perform any one or more of the methods or computer-based functions disclosed herein. The computer system 1200 may operate as a stand-alone device or may be connected to other computer systems or peripheral devices, e.g., by using a network 1210.

In a networked deployment, the computer system 1200 may operate in the capacity of a server or as a client-user computer in a server-client user network environment, or as a peer computer system in a peer-to-peer (or distributed) network environment. The computer system 1200 may also be implemented as or incorporated into various devices, such as a personal computer or a mobile computing device capable of executing a set of instructions 1202 that specify actions to be taken by that machine, including and not limited to, accessing the internet or web through any form of browser. Further, each of the systems described may include any collection of sub-systems that individually or jointly execute a set, or multiple sets, of instructions to perform one or more computer functions.

The computer system 1200 may include a memory 1204 on a bus 1220 for communicating information. Code operable to cause the computer system to perform any of the acts or operations described herein may be stored in the memory 1204. The memory 1204 may be a random-access memory, read-only memory, programmable memory, hard disk drive or any other type of volatile or non-volatile memory or storage device.

The computer system 1200 may include a processor 1208, such as a central processing unit (CPU) and/or a graphics processing unit (GPU). The processor 1208 may include one or more general processors, digital signal processors, application specific integrated circuits, field programmable gate arrays, digital circuits, optical circuits, analog circuits, combinations thereof, or other now known or later-developed devices for analyzing and processing data. The processor 1208 may implement the set of instructions 1202 or other software program, such as manually-programmed or computer-generated code for implementing logical functions. The logical function or any system element described may, among other functions, process and/or convert an analog data source such as an analog electrical, audio, or video signal, or a combination thereof, to a digital data source for audio-visual purposes or other digital processing purposes such as for compatibility for computer processing.

The processor 1208 may include a transform modeler 1206 or contain instructions for execution by a transform modeler 1206 provided a part from the processor 1208. The transform modeler 1206 may include logic for executing the instructions to perform the transform modeling and image reconstruction as discussed in the present disclosure.

The computer system 1200 may also include a disk (or optical) drive unit 1215. The disk drive unit 1215 may include a non-transitory computer-readable medium 1240 in which one or more sets of instructions 1202, e.g., software, can be embedded. Further, the instructions 1202 may perform one or more of the operations as described herein. The instructions 1202 may reside completely, or at least partially, within the memory 1204 and/or within the processor 1208 during execution by the computer system 1200.

The memory 1204 and the processor 1208 also may include non-transitory computer-readable media as discussed above. A "computer-readable medium," "computer-readable storage medium," "machine readable medium," "propagated-signal medium," and/or "signal-bearing medium" may include any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium.

Additionally, the computer system 1200 may include an input device 1225, such as a keyboard or mouse, configured for a user to interact with any of the components of the computer system 1200. It may further include a display 1230, such as a liquid crystal display (LCD), a cathode ray tube (CRT), or any other display suitable for conveying information. The display 1230 may act as an interface for the user to see the functioning of the processor 1208, or specifically as an interface with the software stored in the memory 1204 or the drive unit 1215.

The computer system 1200 may include a communication interface 1236 that enables communications via the communications network 1210. The network 1210 may include wired networks, wireless networks, or combinations thereof. The communication interface 1236 network may enable communications via any number of communication standards, such as 802.11, 802.17, 802.20, WiMax, cellular telephone standards, or other communication standards.

Accordingly, the method and system may be realized in hardware, software, or a combination of hardware and software. The method and system may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein. Such a programmed computer may be considered a special-purpose computer.

The method and system may also be embedded in a computer program product, which includes all the features enabling the implementation of the operations described herein and which, when loaded in a computer system, is able to carry out these operations. Computer program in the present context means any expression, in any language, code or notation, of a set of instructions intended to cause a system having an information processing capability to perform a particular function, either directly or after either or both of the following: a) conversion to another language, code or notation; b) reproduction in a different material form.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents, now presented or presented in a subsequent application claiming priority to this application.

What is claimed is:

1. A system comprising:
   a processing device;
   non-transitory, computer-readable medium storing a set of initial states and a set of unsafe states of a non-linear model of a control system that is to interact with a physical system, and further storing the non-linear model and instructions;
   wherein the processing device is to execute the instructions to compute a piece-wise, exponential discrepancy function of the non-linear model comprising to:
   (i) perform a simulation of the non-linear model using a set of sampled states from the set of initial states, to generate a plurality of trajectories over bounded time, wherein a trajectory is a set of numerical approximations of behaviors of the physical system;
   (ii) determine, for respective pairs of neighboring trajectories from the plurality of trajectories:
   (a) an over-approximation of reachable states of the physical system as an upper bound of a distance between a pair of neighboring trajectories, wherein the distance approaches zero ("0") as initial states of the pair of neighboring trajectories approach each other;
   (b) a linear over-approximation of the reachable states as piece-wise linear segments over a plurality of time intervals; and
   (c) whether the linear over-approximation overlaps in any of the piece-wise linear segments with the unsafe states, to verify the non-linear model of the control system is safe.

2. The system of claim 1, wherein the processing device is further to execute the instructions to, in response to determining that the linear over-approximation from (ii)(b) does not overlap with the unsafe states specified by safety requirements, remove the pair of neighboring trajectories from a set of the plurality of trajectories being analyzed.

3. The system of claim 1, wherein the processing device is further to execute the instructions to, in response to determining that the linear over-approximation from (ii)(b) does overlap with the unsafe states:
   add additional initial states to the set of sampled states to generate an augmented sampling of initial states; and
   repeat (i) and (ii) using the augmented sampling, to produce a more precise over-approximation than the over-approximation determined in (ii)(a).

4. The system of claim 1, wherein to determine the over-approximation of the reachable states in (ii)(a), the processing device is to execute the instructions to employ a Lipchitz constant to construct a coarse, one-step over-approximation of the reachable states as a set S.

5. The system of claim 4, wherein to determine the linear over-approximation in (ii)(b), the processing device is to execute the instructions to calculate the upper bound of the distance as an upper bound on a maximum eigenvalue of a symmetric portion of a Jacobian over the set S, using matrix perturbation, to provide an exponential bound between the pair of neighboring trajectories.

6. The system of claim 5, wherein the processing device is further to execute the instructions to perform a coordinate transformation on the reachable states of the pair of neighboring trajectories before calculating the upper bound on the maximum eigenvalue of the symmetric portion of the Jacobian over the set S.

7. The system of claim 5, wherein the exponential bound for each pair of neighboring trajectories and a respective time interval, of the plurality of time intervals, results in an array of exponential coefficients b[i] of the piece-wise, exponential discrepancy function, and wherein the piece-wise, exponential discrepancy function is a continuously differentiable vector-valued function.

8. The system of claim 7, wherein the piece-wise, exponential discrepancy function is expressed as $$\beta(x_1, x_2, t) = \begin{cases} \|x_1 - x_2\|, & \text{if } t = t_0, \\ \beta(x_1, x_2, t_{i-1})e^{b[i](t-t_{i-1})}, & \text{if } t \in (t_{i-1}, t_i], \end{cases}$$

where $b[1], \ldots, b[k]$ are real constants, $x_1$ and $x_2$ are the pair of neighboring trajectories, and t is time.

9. The system of claim 1, wherein the set of sample states are for a first subsystem of a plurality of interacting subsystems that define the non-linear model, and the processing device is further to execute the instructions to generate a first input-to-state (IS) discrepancy function from the piece-wise, exponential discrepancy function by accounting for inputs to the first subsystem coming from a second subsystem of the plurality of interacting subsystems.

10. The system of claim 9, wherein the inputs to the first subsystem comprise outputs or states from the second subsystem, and inputs to the second subsystem comprise outputs or states from the first subsystem or from a third subsystem.

11. The system of claim 9, wherein the processing device is further to execute the instructions to combine the first IS discrepancy function with at least a second IS discrepancy function for the second subsystem of the plurality of interacting subsystems, to generate a reduced-sized model (M) from which to verify the non-linear model.

12. A method comprising:
   (i) providing, with a processing device of a computing device used for modeling, a non-linear model of a control system that is to interact with a physical system;
   (ii) storing, in a non-transitory computer-readable medium, a set of initial states and a set of unsafe states of the non-linear model;
   (iii) performing, using the processing device, a simulation of the non-linear model using a set of sampled states from the set of initial states, to generate a plurality of trajectories over bounded time, wherein a trajectory is a set of numerical approximations of behaviors of the physical system;

(iv) determining, using the processing device and for respective pairs of neighboring trajectories from the plurality of trajectories:

(a) an over-approximation of reachable states as an upper bound of a distance between a pair of neighboring trajectories, wherein the distance approaches zero ("0") as initial states of the pair of neighboring trajectories approach each other;

(b) a linear over-approximation of the reachable states as piece-wise linear segments over a plurality of time intervals; and (c) whether the linear over-approximation overlaps in any of the piece-wise linear segments with the unsafe states, to verify the non-linear model of the control system is safe.

13. The method of claim 12, further comprising removing the pair of neighboring trajectories from a set of the plurality of trajectories being analyzed in response to determining that the linear over-approximation from (iv)(b) does not overlap with the unsafe states.

14. The method of claim 12, wherein, in response to determining that the linear over-approximation from (iv)(b) does overlap with the unsafe states:

adding additional initial states to the set of sampled states to generate an augmented sampling of initial states; and repeating (iii) and (iv) using the augmented sampling, to produce a more precise over-approximation than the over-approximation determined in (iv)(a).

15. The method of claim 12, wherein determining the over-approximation of the reachable states in (iv)(a) comprises employing a Lipchitz constant to construct a coarse, one-step over-approximation of the reachable states as a set S.

16. The method of claim 15, wherein to determine the linear over-approximation in (iv)(b), calculating the upper bound of the distance as an upper bound on a maximum eigenvalue of a symmetric portion of a Jacobian over the set S, using matrix perturbation, to provide an exponential bound between the pair of neighboring trajectories.

17. The method of claim 16, further comprising performing a coordinate transformation on the reachable states of the pair of neighboring trajectories before calculating the upper bound on the maximum eigenvalue of the symmetric portion of the Jacobian over the set S.

18. The method of claim 16, wherein the exponential bound for each pair of neighboring trajectories and a respective time interval, of the plurality of time intervals, results in an array of exponential coefficients b[i] of the piece-wise, exponential discrepancy function, and wherein the piece-wise, exponential discrepancy function is a continuously differentiable vector-valued function.

19. The method of claim 18, wherein the piece-wise, exponential discrepancy function is expressed as $$\beta(x_1, x_2, t) = \begin{cases} \|x_1 - x_2\|, & \text{if } t = t_0, \\ \beta(x_1, x_2, t_{i-1})e^{b[i](t-t_{i-1})}, & \text{if } t \in (t_{i-1}, t_i], \end{cases}$$

where b[1], . . . , b[k] are real constants, $x_1$ and $x_2$ are the pair of neighboring trajectories, and t is time.

20. The method of claim 12, wherein the set of sample states are for a first subsystem of a plurality of interacting subsystems that define the non-linear model, the method further comprising generating a first input-to-state (IS) discrepancy function from the piece-wise, exponential discrepancy function by accounting for inputs to the first subsystem coming from a second subsystem of the plurality of interacting subsystems.

21. The method of claim 20, wherein the inputs to the first subsystem comprise outputs or states from the second subsystem, and inputs to the second subsystem comprise outputs or states from the first subsystem or from a third subsystem.

22. The method of claim 20, further comprising combining the first IS discrepancy function with at least a second IS discrepancy function for the second subsystem of the plurality of interacting subsystems, to generate a reduced-sized model (M) from which to verify the non-linear model.

23. A non-transitory computer-readable medium in which to store instructions used for modeling, and to store a set of initial states and a set of unsafe states of a non-linear model of a control system that is to interact with a physical system, and wherein the instructions are executable by a processing device to:

(i) perform, using the processing device, a simulation of the non-linear model using a set of sampled states from the set of initial states, to generate a plurality of trajectories over bounded time, wherein a trajectory is a set of numerical approximations of behaviors of the physical system;

(ii) determine, using the processing device and for respective pairs of neighboring trajectories from the plurality of trajectories:

(a) an over-approximation of reachable states as an upper bound of a distance between a pair of neighboring trajectories, wherein the distance approaches zero ("0") as initial states of the pair of neighboring trajectories approach each other;

(b) a linear over-approximation of the reachable states as piece-wise linear segments over a plurality of time intervals; and (c) whether the linear over-approximation overlaps in any of the piece-wise linear segments with the unsafe states, to verify the non-linear model of the control system is safe.

24. The non-transitory computer-readable medium of claim 23, wherein the instructions are further executable by the processing device to, in response to determining that the linear over-approximation from (ii)(b) does overlap with the unsafe states:

add additional initial states to the set of sampled states to generate an augmented sampling of initial states; and repeat (i) and (ii) using the augmented sampling, to produce a more precise over-approximation than the over-approximation determined in (ii)(a).

25. The non-transitory computer-readable medium of claim 23, wherein to determine the over-approximation of the reachable states in (ii)(a), the instructions are executable by the processing device to employ a Lipchitz constant to construct a coarse, one-step over-approximation of the reachable states as a set S; and wherein to determine the linear over-approximation in (ii)(b), the instructions are further executable by the processing device to calculate the upper bound of the distance as an upper bound on a maximum eigenvalue of a symmetric portion of a Jacobian over the set S, using matrix perturbation, to provide an exponential bound between the pair of neighboring trajectories.

\* \* \* \* \*